United States Patent
Jeong

(10) Patent No.: US 10,527,929 B2
(45) Date of Patent: Jan. 7, 2020

(54) METHODS OF IMPROVING OPTICAL PROXIMITY CORRECTION MODELS AND METHODS OF FABRICATING SEMICONDUCTOR DEVICES USING THE SAME

(71) Applicant: Samsung Electronics Co., Ltd., Suwon-si, Gyeonggi-do (KR)

(72) Inventor: Moon-Gyu Jeong, Gwangmyeong-si (KR)

(73) Assignee: Samsung Electronics Co., Ltd. (KR)

( * ) Notice: Subject to any disclaimer, the term of this patent is extended or adjusted under 35 U.S.C. 154(b) by 109 days.

(21) Appl. No.: 15/885,134

(22) Filed: Jan. 31, 2018

(65) Prior Publication Data

US 2019/0004418 A1    Jan. 3, 2019

(30) Foreign Application Priority Data

Jun. 30, 2017  (KR) ........................ 10-2017-0083815

(51) Int. Cl.

| G06F 17/50 | (2006.01) |
| H01L 21/027 | (2006.01) |
| G03F 1/36 | (2012.01) |
| G03F 7/20 | (2006.01) |
| G03F 1/70 | (2012.01) |

(52) U.S. Cl.
CPC ................ G03F 1/36 (2013.01); G03F 1/70 (2013.01); G03F 7/70441 (2013.01); G06F 17/5081 (2013.01); H01L 21/0274 (2013.01)

(58) Field of Classification Search
CPC .......... G03F 1/36; G03F 1/70; G03F 7/70441; G06F 17/5081

USPC ....................................................... 716/53, 54
See application file for complete search history.

(56) References Cited

U.S. PATENT DOCUMENTS

| 6,472,108 B1 * | 10/2002 | Lin ........................ G03F 1/36 430/30 |
| 7,420,710 B2 | 9/2008 | Klatchko et al. |
| 7,820,341 B2 | 10/2010 | Laidig et al. |
| 8,710,465 B2 | 4/2014 | Van De Peut et al. |
| 8,718,354 B2 | 5/2014 | Stroessner et al. |

(Continued)

FOREIGN PATENT DOCUMENTS

JP    2016174152 A    9/2016

*Primary Examiner* — Sun J Lin
(74) *Attorney, Agent, or Firm* — Myers Bigel, P.A.

(57) ABSTRACT

A method of fabricating a semiconductor device includes designing a layout, performing an optical proximity correction (OPC) process to correct the designed layout, fabricating a first photomask using the corrected designed layout, and forming patterns on a substrate using the first photomask. The OPC process includes generating an OPC model and correcting the designed layout using the generated OPC model. The generation of the OPC model includes rasterizing a planar image of an actual pattern to obtain first label data, rasterizing a simulation image of a simulation pattern to obtain second label data, the simulation pattern being obtained using the OPC model, in which a parameter set including process parameters is set, comparing the first label data with the second label data to obtain comparison data, and correcting the process parameters of the parameter set, based on the comparison data.

20 Claims, 27 Drawing Sheets

(56) References Cited

U.S. PATENT DOCUMENTS

| | | |
|---|---|---|
| 8,863,045 B1 * | 10/2014 | Chen et al. ............... G03F 1/36 716/53 |
| 8,918,743 B1 | 12/2014 | Yan et al. |
| 8,959,461 B2 | 2/2015 | Shibahara et al. |
| 9,542,740 B2 | 1/2017 | Kim et al. |
| 9,671,686 B2 | 6/2017 | Choi et al. |
| 9,996,658 B2 * | 6/2018 | Kim et al. ............... G03F 1/36 |
| 10,025,175 B2 * | 7/2018 | Tsai et al. ............... G03F 1/36 |
| 2007/0165938 A1 * | 7/2007 | Matsumura et al. ........................ G01N 21/95607 382/144 |

* cited by examiner

METHODS OF IMPROVING OPTICAL PROXIMITY CORRECTION MODELS AND METHODS OF FABRICATING SEMICONDUCTOR DEVICES USING THE SAME

CROSS-REFERENCE TO RELATED APPLICATIONS

This U.S. non-provisional patent application claims priority under 35 U.S.C. § 119 to Korean Patent Application No. 10-2017-0083815, filed on Jun. 30, 2017, in the Korean Intellectual Property Office, the entire contents of which are hereby incorporated by reference herein.

BACKGROUND OF THE INVENTION

The present disclosure relates to methods of fabricating semiconductor devices, and in particular, to methods of fabricating semiconductor devices using an optimized and/or improved optical proximity correction (OPC) model.

Due to their small size, multifunctional usage, and/or low-cost characteristics, semiconductor devices are important elements in the electronic industry. The semiconductor devices may be classified, for example, into a memory device for storing data, a logic device for processing data, and a hybrid device including both of memory and logic elements. To meet the increased demand for electronic devices with faster speeds and/or lower power consumption, semiconductor devices with high reliability, high performance, and/or multiple functions are desired. To satisfy this demand, the complexity and/or integration density of semiconductor devices are being increased, resulting in smaller manufacturing designs and patterns for the semiconductor devices.

However, in a manufacturing design having a complex mask pattern or having a pattern with sharply changing sizes and line widths, a lithography process used to transfer the design to a semiconductor wafer may be affected by diffraction of light in adjacent patterns. As a result, the layout of the transferred pattern may be different from the designed layout. In order to avoid this phenomenon, a region may be intentionally distorted when designing a mask through the use of an OPC process. However, conventional OPC processes may be inefficient and/or may not sufficiently compensate for diffracted light.

SUMMARY

Some embodiments of the inventive concepts provide methods of optimizing and/or improving an OPC model and thereby improving reliability of the OPC model.

Some embodiments of the inventive concepts provide methods of fabricating semiconductor devices using an optimized and/or improved OPC model.

According to some embodiments of the inventive concepts, a method of fabricating a semiconductor device may include designing a layout, performing an OPC process to correct the designed layout, fabricating a first photomask using the corrected layout, and forming patterns on a substrate using the first photomask. The OPC process may include generating an OPC model and correcting the designed layout using the generated OPC model. The generating of the OPC model may include rasterizing a planar image of an actual pattern to obtain first label data, rasterizing a simulation image of a simulation pattern to obtain second label data, the simulation pattern being obtained using an OPC model, in which a parameter set including process parameters is set, comparing the first label data with the second label data to obtain comparison data, and correcting the process parameters of the parameter set, based on the comparison data.

According to some embodiments of the inventive concepts, a method of fabricating a semiconductor device may include generating an OPC model, and performing an optical proximity correction process on a designed layout using the generated OPC model. The generating of the OPC model may include dividing a planar image of an actual pattern into a first plurality of pixels, the plurality of pixels of the planar image including first pixels that overlap the actual pattern, dividing a simulation image of a simulation pattern into a second plurality of pixels, the simulation pattern being obtained using the OPC model, the second plurality of pixels of the simulation image including second pixels that overlap the simulation pattern, comparing the first pixels with the second pixels to obtain comparison data, and correcting a parameter set of the OPC model, based on the comparison data.

According to some embodiments of the inventive concepts, a method of generating an OPC model may include forming an actual pattern on a substrate using a test layout including a test pattern, dividing a planar image of the actual pattern into a first plurality of pixels, labeling the first plurality of pixels of the planar image, based on a first contour of the actual pattern, to obtain first label data, simulating the test layout using an OPC model to obtain a simulation image, dividing the simulation image into a second plurality of pixels, labeling the second plurality of pixels of the simulation image, based on a second contour of a pattern in the simulation image, to obtain second label data, comparing the first label data with the second label data to obtain comparison data, and correcting a parameter set of the OPC model, based on the comparison data.

BRIEF DESCRIPTION OF THE DRAWINGS

Example embodiments of the inventive concepts will be more clearly understood from the following brief description taken in conjunction with the accompanying drawings. The accompanying drawings represent non-limiting, example embodiments as described herein.

It should be noted that these figures are intended to illustrate the general characteristics of methods, structure, and/or materials utilized in certain example embodiments and to supplement the written description provided below. These drawings are not, however, to scale and may not precisely reflect the structural or performance characteristics of any given embodiment, and should not be interpreted as defining or limiting the range of values or properties encompassed by example embodiments of the inventive concepts. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1:
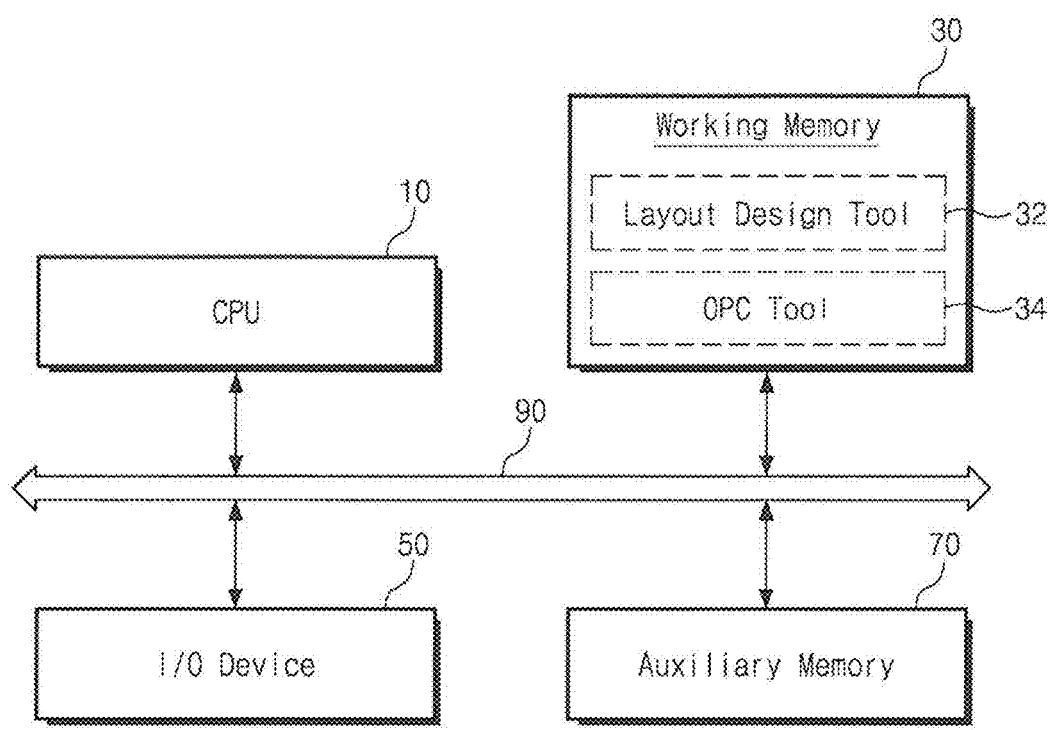
FIG. 1 is a block diagram illustrating a computer system for performing a semiconductor design process, according to some embodiments of the inventive concepts.

FIG. 1 is a block diagram illustrating a computer system for performing a semiconductor design process, according to some embodiments of the inventive concepts. Referring to FIG. 1, a computer system may include a central processing unit (CPU) 10, a working memory 30, an input-output device 50, and an auxiliary memory device 70. In some embodiments, the computer system may be a customized system for performing a layout design process according to some embodiments of the inventive concepts. Furthermore, the computer system may be configured to execute various design and check simulation programs.

The CPU 10 may be configured to run a variety of software programs, such as application programs, operating systems, and/or device drivers. For example, the CPU 10 may be configured to run an operating system (not shown) loaded on the working memory 30. Furthermore, the CPU 10 may be configured to run various application programs on the operating system. For example, the CPU 10 may be configured to run a layout design tool 32 and/or OPC tool 34 loaded on the working memory 30.

The operating system or application programs may be loaded on the working memory 30. For example, when the computer system starts a booting operation, an operating system image (not shown) stored in the auxiliary memory device 70 may be loaded on the working memory 30 according to a booting sequence. In the computer system, overall input/output operations may be managed by the operating system. Some application programs, which may be selected by a user and/or be provided for basic services, may be loaded on the working memory 30. According to some embodiments of the inventive concepts, the layout design tool 32 and/or OPC tool 34 may be loaded on the working memory 30, from the auxiliary memory device 70.

The layout design tool 32 may provide a function for changing biasing data for specific layout patterns. For example, the layout design tool 32 may be configured to allow the specific layout patterns to have shapes and positions different from those defined by a design rule. The layout design tool 32 may be configured to perform a design rule check (DRC) under the changed condition of the bias data. The OPC tool 34 may be configured to perform an OPC process on layout data, which is obtained by the layout design tool 32. The working memory 30 may include one or more volatile memory devices (e.g., static random access memory (SRAM) and/or dynamic random access memory (DRAM) devices) and/or nonvolatile memory devices (e.g., phase-change random access memory (PRAM), magnetoresistive random access memory (MRAM), resistive random access memory (ReRAM), ferroelectric random access memory (FRAM), and/or NOR flash memory devices).

The input-output device 50 may be configured to control user input and output operations of user interface devices. For example, the input-output device 50 may include a keyboard or a monitor, allowing a designer to input relevant information. By using the input-output device 50, the designer may receive information on several regions or data paths, to which adjusted operating characteristics will be applied, of a semiconductor device. The input-output device 50 may be configured to display a progress status or a process result of the OPC tool 34.

The auxiliary memory device 70 may serve as a storage medium for the computer system. The auxiliary memory device 70 may be configured to store application programs, an operating system image, and various data. The auxiliary memory device 70 may be provided in the form of one of memory cards (e.g., MultiMediaCard (MMC), embedded MMC (eMMC), Secure Digital (SD), MicroSD, and so forth) or a hard disk drive (HDD). The auxiliary memory device 70 may include a NAND flash memory device with a large memory capacity. In some embodiments, the auxiliary memory device 70 may include at least one of next-generation nonvolatile memory devices (e.g., PRAM, MRAM, ReRAM, or FRAM) or NOR flash memory devices.

A system interconnector 90 may serve as a system bus for realizing a network in the computer system. The CPU 10, the working memory 30, the input-output device 50, and the auxiliary memory device 70 may be connected to each other through the system interconnector 90, and thus, data may be exchanged therebetween. However, the system interconnector 90 may not be limited to the previously described configuration. For example, it may further include one or more additional elements for increasing efficiency in data communication.

Figure 2:
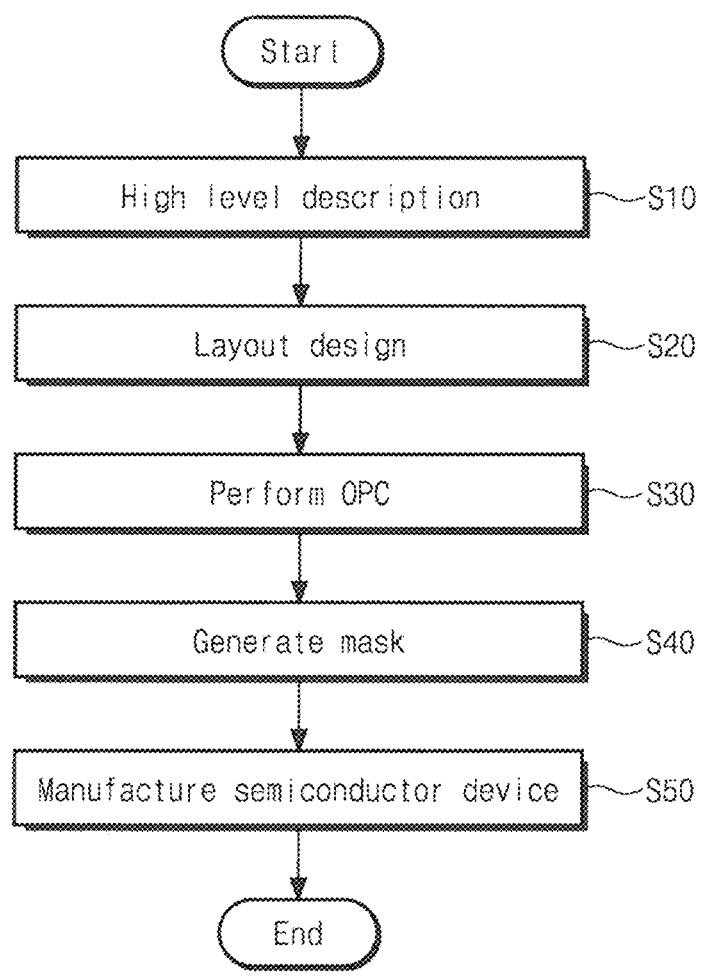
FIG. 2 is a flow chart illustrating a method of designing and fabricating a semiconductor device, according to some embodiments of the inventive concepts.

FIG. 2 is a flow chart illustrating a method of designing and fabricating semiconductor devices, according to some embodiments of the inventive concepts.

Referring to FIG. 2, a high-level design process for a semiconductor integrated circuit may be performed using the computer system described with reference to FIG. 1 (in S10). For example, in the high-level design process, an integrated circuit to be designed may be described in terms of high-level computer language (e.g., C language, Very High Speed Integrated Circuit Hardware Description Language (VHDL), Verilog, etc.). Circuits designed by the high-level design process may be more concretely described by a register transfer level (RTL) coding or a simulation. Furthermore, codes generated by the RTL coding may be converted into a netlist, and the results may be combined with each other to wholly describe a semiconductor device. The combined schematic circuit may be verified by a simulation tool. In certain embodiments, an adjusting step may be further performed, based on a result of the verification step.

A layout design process may be performed to realize a logically complete form of the semiconductor integrated circuit on a silicon wafer (in S20). For example, the layout design process may be performed, based on the schematic circuit prepared in the high-level design process or the corresponding netlist. The layout design process may include a routing step of placing and connecting various standard cells that are provided from a cell library, based on a predetermined design rule.

The cell library may contain information on operation, speed, and power consumption of cells. In certain embodiments, a cell library for representing a layout of a circuit in a gate level may be defined in or by the layout design tool. Here, the layout may be prepared to define or describe shapes, positions, and/or dimensions of patterns constituting transistors and metal interconnection lines, which may be subsequently formed on a silicon wafer. For example, forming an inverter circuit on a silicon wafer may include preparing or drawing a layout for patterns (e.g., PMOS, NMOS, N-WELL, gate electrodes, and/or metal interconnection lines thereon). For this, at least one or more inverters defined in the cell library may be selected.

Furthermore, a routing step of connecting the selected cells to each other may be performed. In detail, the routing step may be performed on the selected and disposed standard cells to connect them to upper interconnection lines. These steps may be automatically or manually performed in the layout design tool. In certain embodiments, a step of placing the standard cells and establishing routing structures thereto may be automatically performed by a Place & Routing tool.

After the routing step, a verification step may be performed on the layout to check whether there is a portion violating a given design rule. In some embodiments, the verification step may include evaluating verification items, such as a design rule check (DRC), an electrical rule check (ERC), and/or a layout vs schematic (LVS). The evaluating of the DRC item may be performed to evaluate whether the layout meets the given design rule. The evaluating of the ERC item may be performed to evaluate whether there is an issue of electrical disconnection in the layout. The evaluating of the LVS item may be performed to evaluate whether the layout is prepared to coincide with the gate-level netlist.

An optical proximity correction (OPC) step may be performed (in S30). The OPC step may be performed to correct optical proximity effects, which may occur when a photolithography process is performed on a silicon wafer using a photomask manufactured based on the layout. The optical proximity effect may be an unintended optical effect (such as refraction or diffraction) which may occur in the exposing process using the photomask manufactured based on the layout. In the OPC step, the layout may be modified to have a reduced difference in shape between designed patterns and actually-formed patterns, which may be caused by the optical proximity effects. As a result of the OPC step, the shapes and positions of patterns in the designed layout may be changed or biased. The OPC step will be described in more detail with reference to FIGS. 3 to 8.

A photomask may be manufactured, based on the layout modified by the OPC step (in S40). In some embodiments, the photomask may be manufactured by patterning a chromium layer provided on a glass substrate, using the layout pattern data.

The photomask manufactured may be used to manufacture a semiconductor device (in S50). In the actual fabricating process, the exposing and etching steps may be repeatedly performed, and thus, patterns defined in the layout design process may be sequentially formed on a semiconductor substrate.

Figure 3:
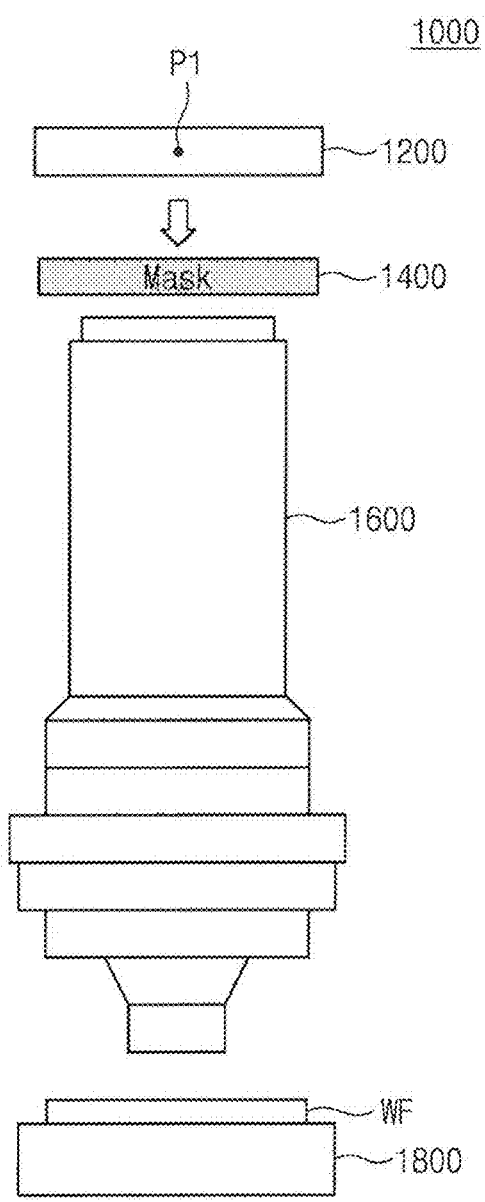
FIG. 3 is a schematic diagram illustrating a photolithography system, in which a photomask according to some embodiments of the inventive concepts is used.

FIG. 3 is a schematic diagram illustrating a photolithography system, in which a photomask according to some embodiments of the inventive concepts is used. A photolithography system 1000 may include a light source 1200, a photomask 1400, a reduction projection apparatus 1600, and a substrate stage 1800. Although not illustrated in FIG. 3, some additional elements may be provided in the photolithography system 1000. For example, the photolithography system 1000 may further include a sensor for measuring a height and a slope of a top surface of a substrate WF.

The light source 1200 may be configured to emit light. The light emitted from the light source 1200 may be incident onto the photomask 1400. To control a focal length, a lens may be provided between the light source 1200 and the photomask 1400. The light source 1200 may be configured to emit an ultraviolet light. For example, the light source 1200 may be a KrF light source (at 234 nm), an ArF light source (at 193 nm), and so forth. The light source 1200 may include a single point light source P1, but the inventive concepts are not limited thereto. In certain embodiments, the light source 1200 may be configured to have a plurality of point light sources.

The photomask 1400 may include image patterns, which are used to transcribe or print the designed layout onto the substrate WF. The image patterns may be formed based on layout patterns which are prepared through layout design and OPC steps described above. The image patterns may be defined by transparent and opaque regions formed on the photomask 1400. The transparent region may be formed by etching the metal layer (e.g., the chromium layer) that is provided on the photomask 1400. The transparent region may be configured to allow light, which is incident from the light source 1200, to propagate toward the substrate WF. By contrast, the opaque region may be configured to prevent the light from propagating toward the substrate WF.

The light passing through the transparent region of the photomask 1400 may be incident onto a photoresist layer, which may be formed on the substrate WF, through the reduction projection apparatus 1600, and as a result, photoresist patterns may be formed on the substrate WF. The photoresist patterns may have shapes corresponding to the image patterns of the photomask 1400. That is, by using the reduction projection apparatus 1600, it may be possible to form the photoresist patterns, whose shapes are defined by the image patterns of the photomask 1400, on the substrate WF.

The substrate stage 1800 may be configured to support the substrate WF. The substrate WF may include, for example, a silicon wafer. The reduction projection apparatus 1600 may include an aperture. The aperture may be used to control a depth of focus when the ultraviolet light emitted from the light source 1200 is incident onto the substrate WF. As an example, the aperture may include a dipole or quadruple aperture. The reduction projection apparatus 1600 may further include a lens for controlling a focal length.

As an integration density of a semiconductor device increases, a distance between the image patterns of the photomask 1400 may be reduced, thereby causing an optical proximity issue such as undesired interference and diffraction. As a result of the optical proximity issue, the photoresist patterns formed on the substrate WF may have distorted shapes (i.e., different from those of the image patterns of the photomask 1400). The distortion of the photoresist patterns may lead to malfunction of an electronic device or circuit to be formed on the substrate WF.

A resolution enhancement technology may be used to prevent the distortion of the photoresist patterns. An OPC technology, which is used in the step S30 of FIG. 2, may be an example of the resolution enhancement technology. According to the OPC technology, the optical distortion issue, which is caused by interference and diffraction, may be quantitatively predicted by a simulation process using an OPC model. The designed layout may be corrected and/or biased, based on the predicted result. Based on the corrected layout, image patterns may be formed on the photomask 1400, and in the case where the photomask 1400 is manufactured by this method, the photoresist patterns may be formed in desired shapes on the substrate WF.

A layout of a semiconductor device may include a plurality of layers. In some embodiments, the OPC step may be performed to correct a layout for each of the layers. In other words, the OPC step may be independently performed on each of the plurality of layers. A semiconductor device may be fabricated by forming the plurality of layers on a substrate through a semiconductor process. As an example, a semiconductor device may include a plurality of stacked metal layers constituting a specific circuit.

Figure 4:
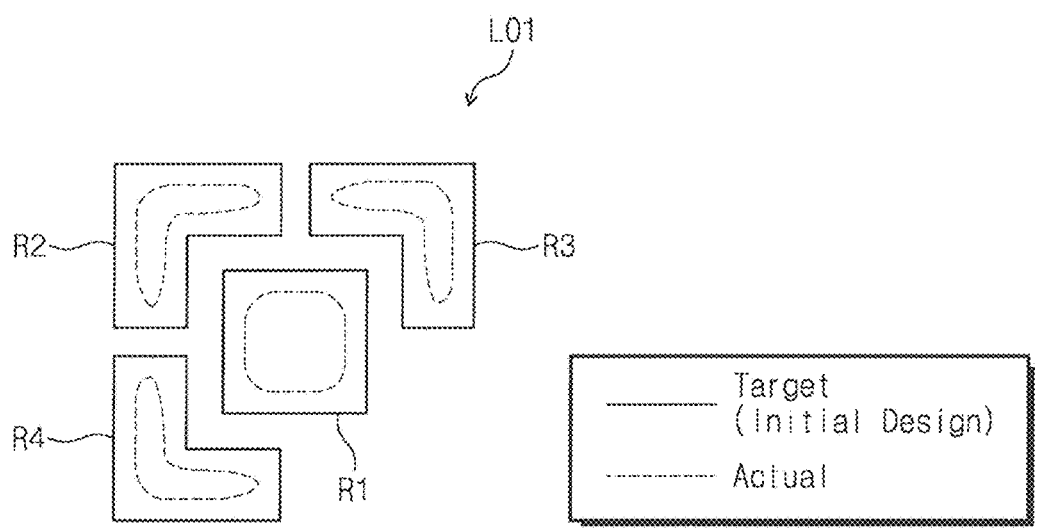
FIG. 4 is a diagram illustrating a layout according to some embodiments of the inventive concepts.

FIG. 4 is a diagram illustrating a layout according to some embodiments of the inventive concepts. In FIG. 4, a solid line depicts target patterns that are desired to be formed on the substrate WF of FIG, and a dotted line depicts actual patterns that are actually formed on the substrate WF of FIG. 3.

A designed layout LO1 may include first to fourth circuit patterns R1, R2, R3, and R4. In order to reduce complexity in the drawings and to provide better understanding of the inventive concepts, an example of a shape of the designed layout LO1 is illustrated in FIG. 4, but the inventive concepts are not limited thereto. The designed layout LO1 may be provided as an initial design layout. The first to fourth circuit patterns R1, R2, R3, and R4, which are depicted by the solid lines in FIG. 4, may illustrate target patterns that are desired to be formed on the substrate WF.

As described above, owing to the optical distortion issue caused by interference and diffraction, photoresist patterns on the substrate WF may have shapes different from those in the designed layout LO1. For example, even when the image patterns of the photomask 1400 are formed to have shapes depicted by the solid lines of FIG. 4, the first to fourth circuit patterns R1, R2, R3, and R4 to be formed on the substrate WF may have distorted shapes that are depicted by the dotted lines of FIG. 4. In this case, a circuit formed on the substrate WF may be abnormally operated.

An OPC step may be performed to prevent the distortion of the patterns. For example, to reduce a difference between the actual pattern (depicted by the dotted line of FIG. 4) and the target pattern (depicted by the solid line of FIG. 4), the designed layout LO1 may be biased through the OPC step. As used herein, biasing the designed layout may refer to adjusting and/or altering the designed layout to generate a biased and/or corrected layout. The image patterns of the photomask 1400 may be formed, based on the biased layout. In the case where the photomask 1400 manufactured through this process is used for a photolithography process, the actual patterns may be formed on the substrate WF to have substantially the same shapes as those of the first to fourth circuit patterns R1, R2, R3, and R4 defined in the designed layout LO1.

Figure 5:
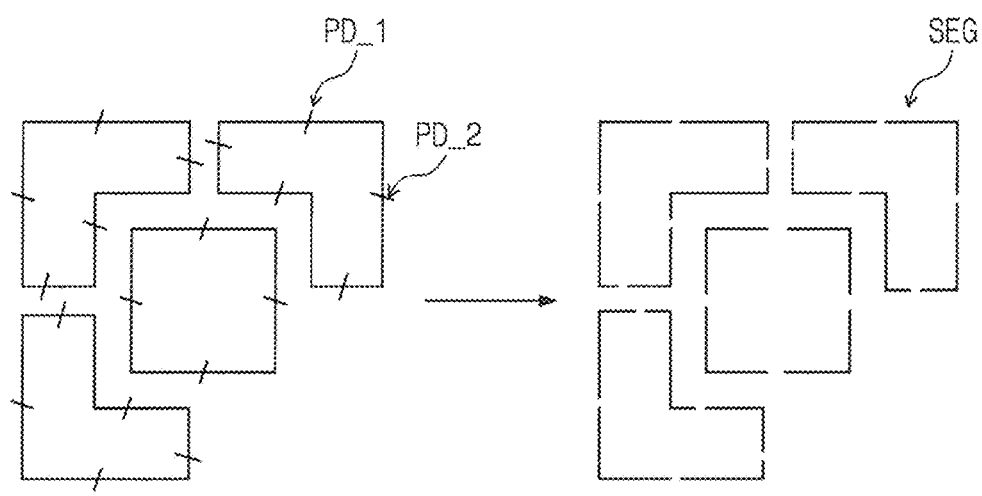
FIG. 5 is a diagram illustrating a process of dividing a contour of a designed layout of FIG. 4 into a plurality of segments, which may be performed as a part of an OPC step.

FIG. 5 is a diagram illustrating a method of dividing a contour of a designed layout of FIG. 4 into a plurality of segments, which may be performed as a part of the OPC step. Referring to FIG. 5, a plurality of division points may be set on a contour of a designed layout. As an example, a first division point PD_1 and a second division point PD_2 may be set on the contour of the designed layout. One segment SEG may be defined by the first division point PD_1 and the second division point PD_2. For example, the segment SEG may be the portion of the designed layout between the first division point PD_1 and the second division point PD_2. The contour of the designed layout may be divided into a plurality of segments in a similar manner, based on the division points.

In the present specification, the term "division" may not mean a physical division. Furthermore, although in FIG. 5, a plurality of segments are illustrated as if they were physically spaced apart from each other, FIG. 5 is a schematic diagram that is presented for the purpose of providing better understanding of the inventive concepts.

In the OPC step, each of the divided segments SEG may be a unit object, to which the biasing can be applied. Each of the divided segments SEG may be independently biased. For example, one of the segments SEG may be biased in one of a first direction (e.g., a positive or outward direction) and a second direction (e.g., a negative or inward direction), independent of the others of the segments SEG. Each of the divided segments SEG may be biased to reduce a difference in shape or size between the actual and target patterns. The biasing of the divided segments SEG may be performed by the OPC tool 34 of FIG. 1. An example of a corrected layout, which is obtained based on the biased segments, is illustrated in FIG. 6.

Figure 6:
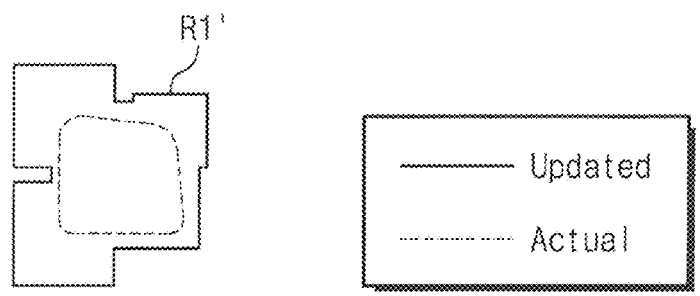
FIG. 6 is a diagram illustrating a layout corrected by the OPC step of FIG. 5.

FIG. 6 is a diagram illustrating a layout corrected by the OPC step of FIG. 5. Referring to FIG. 6, the corrected layout may include a first correction pattern R1' that is corrected from the first circuit pattern R of FIG. 4. For convenience in illustration, the second to fourth circuit patterns R2, R3, and R4 of FIG. 4 are omitted from FIG. 6. As previously described with reference to FIG. 5, the contour of the first circuit pattern R1 of FIG. 4 may be divided into a plurality of segments, and each of the divided segments may be biased. As illustrated in FIG. 6, each of the segments may be biased in one of the first direction (e.g., the positive or outward direction) and the second direction (e.g., the negative or inward direction). In certain embodiments, at least one of the segments may not be biased. FIG. 6 shows an example of the first correction pattern R1' that is obtained as a result of the biasing.

The dotted line of FIG. 6 depicts an actual pattern which may be formed on the substrate WF of FIG. 3 when the first correction pattern R1' is used. By biasing each of the divided segments, it may be possible to reduce a difference in shape or size between the actual pattern and the target pattern.

Figure 7:
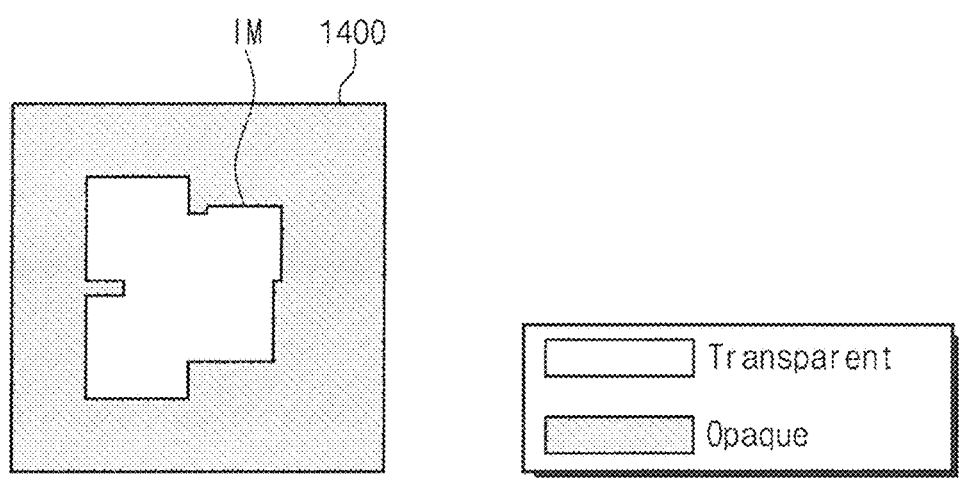
FIG. 7 is a diagram illustrating a photomask fabricated based on the corrected layout of FIG. 6.

FIG. 7 is a diagram illustrating a photomask fabricated based on the first correction pattern R1' of FIG. 6. As an example, referring to FIG. 7, the photomask 1400 may include an image pattern IM corresponding to the first correction pattern R1' of FIG. 6. The photomask 1400 may include a transparent region and an opaque region. The opaque region may be configured to prevent light from passing therethrough. By contrast, the transparent region may be configured to allow light, which may be emitted from the light source 1200 of FIG. 3, to pass therethrough. Light passing through the photomask 1400 may be incident onto a photoresist layer on the substrate WF of FIG. 3. The image pattern IM may be the transparent region.

Figure 8:
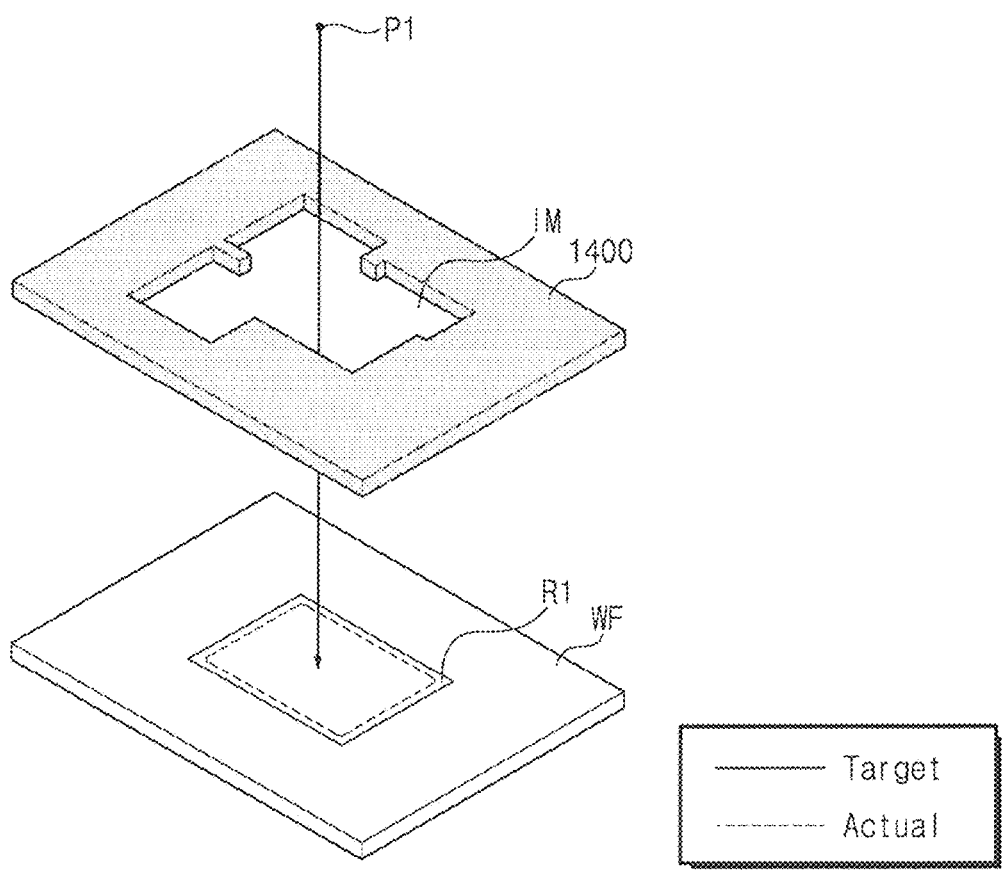
FIG. 8 is a diagram illustrating a process of printing a circuit pattern on a substrate using the photomask of FIG. 7.

FIG. 8 is a diagram illustrating a process of printing a circuit pattern on a substrate using the photomask of FIG. 7. A point light source P1 in the light source 1200 of FIG. 3 may be configured to emit light toward the photomask 1400. The emitted light may pass through the transparent region of the image pattern IM and then may be incident onto the photoresist layer on the substrate WF. Accordingly, the first circuit pattern R1 corresponding to the image pattern IM may be formed on the substrate WF.

An actual pattern printed on the substrate WF may have a shape depicted by the dotted line. The actual pattern may have substantially the same shape and size as those of the target pattern depicted by the solid line. That is, by using the previously-described OPC step, it may be possible to reduce a difference in shape and/or size between the actual and target patterns.

Figure 9:
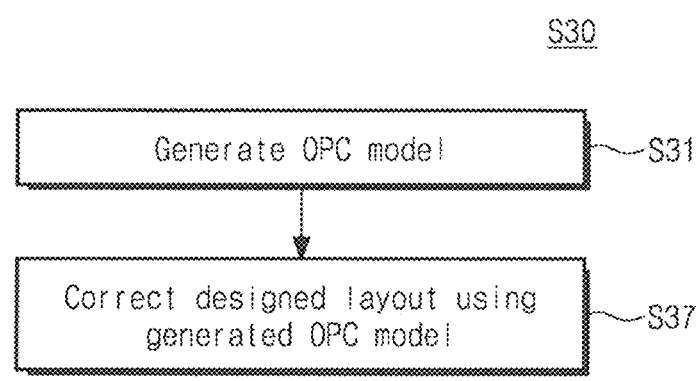
FIG. 9 is a flow chart illustrating an OPC method according to some embodiments of the inventive concepts.

FIG. 9 is a flow chart illustrating an optical proximity correction method according to some embodiments of the inventive concepts. Referring to FIG. 9, the OPC step on the designed layout (in S30) may include generating an optimized and/or improved OPC model (in S31) and then correcting and/or biasing a designed layout (e.g., the result obtained by the step S20 of FIG. 2) using the generated OPC model (in S37). For example, by performing a simulation using the improved OPC model, an actual pattern which is formed from the designed layout may be predicted. The designed layout may be corrected and/or biased, based on the predicted result. The steps shown in FIG. 9 may be performed in the OPC tool 34 of FIG. 1.

Figure 10:
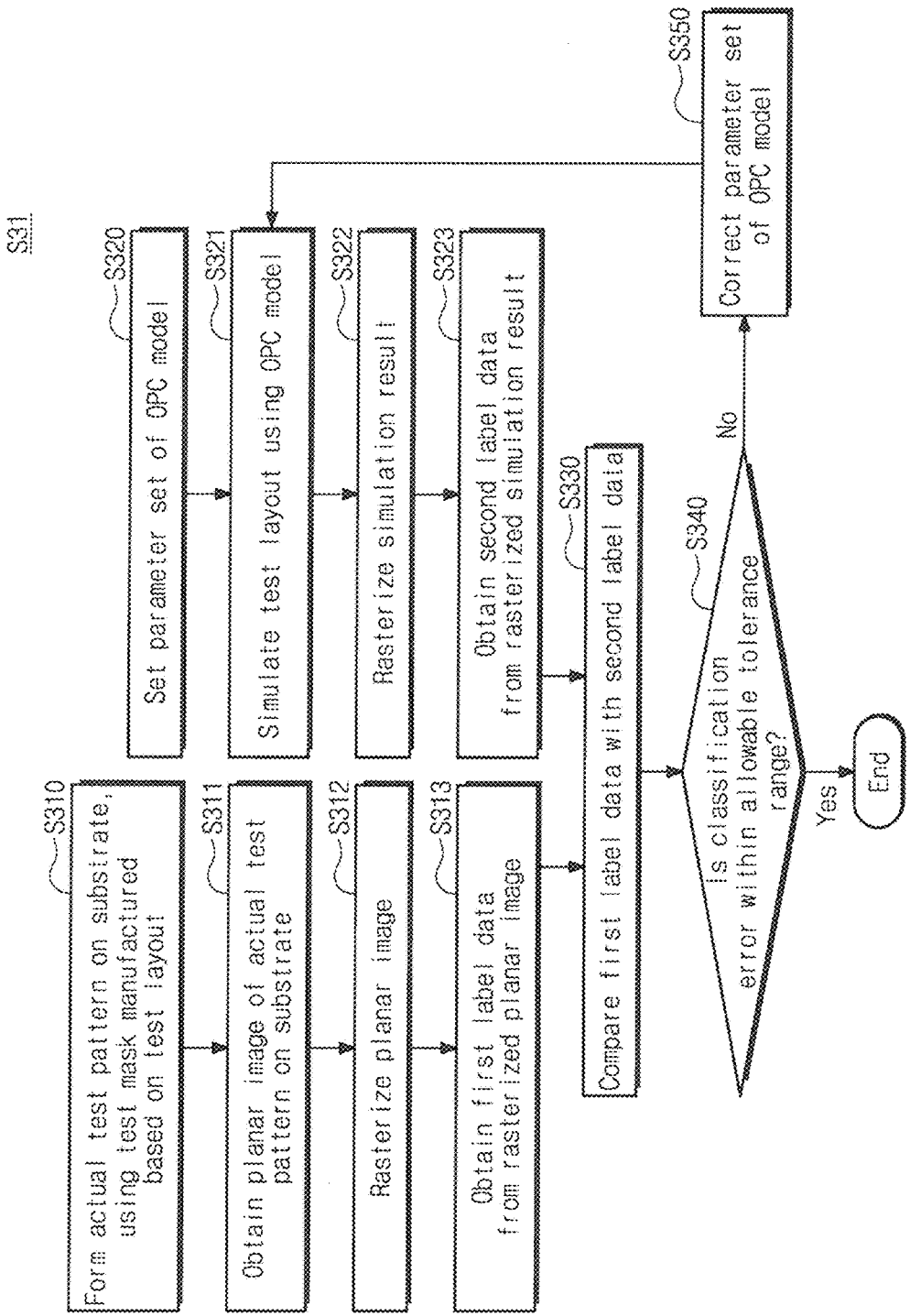
FIG. 10 is a flow chart illustrating a detailed example of an improving step of an OPC model shown in FIG. 9.
Figure 11:
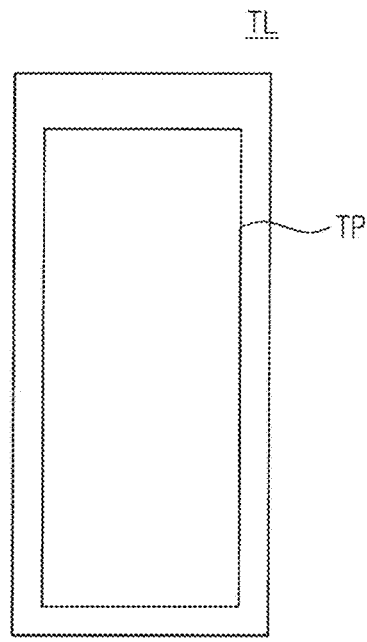
FIG. 11 is a plan view illustrating a test layout according to some embodiments of the inventive concepts.

The step of generating the optimized and/or improved OPC model (in S31) will be described in more detail below with reference to FIG. 10. FIG. 10 is a flow chart illustrating a detailed example of a generating step of an OPC model shown in FIG. 9. FIG. 1 is a plan view illustrating a test layout according to some embodiments of the inventive concepts. Referring to FIGS. 10 and 11, a test layout TL may be provided. The test layout TL may include a test pattern TP. The test pattern TP may have a polygonal shape (e.g., a rectangular shape), but the inventive concepts are not limited thereto. In some embodiments, a shape of the test pattern TP may be variously changed, and in certain embodiments, a plurality of test patterns TP may be provided in the test layout TL.

Figure 12:
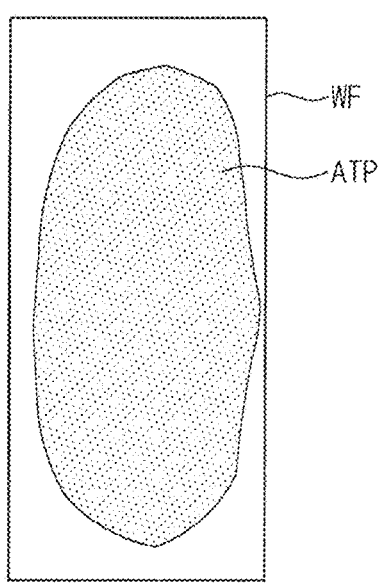
FIG. 12 is a plan view illustrating a shape of a pattern formed on a substrate using the test layout of FIG. 11.
Figure 13:
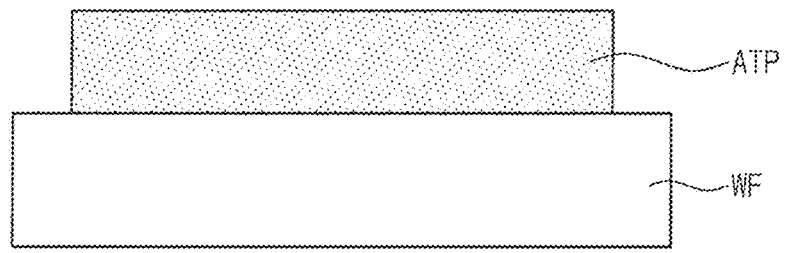
FIG. 13 is a sectional view illustrating a vertical section of the pattern of FIG. 12.

FIG. 12 is a plan view illustrating a shape of a pattern formed on a substrate using the test layout of FIG. 11. FIG. 13 is a sectional view illustrating a vertical section of the pattern of FIG. 12. Referring to FIGS. 10, 12, and 13, an actual test pattern ATP may be formed on a substrate WF using a test mask, which is manufactured based on the test layout TL (in S310). For example, the test mask (e.g., a test photomask) may be manufactured and may include an image pattern formed based on the test layout TL. The actual test pattern ATP may be formed on the substrate WF by a photolithography process using the test mask. In some embodiments, the actual test pattern ATP may be formed by exposing and developing a photoresist layer coated on the substrate WF (e.g., using substantially the same method as that described with reference to FIG. 8).

Due to some process parameters, such as optical interference and diffraction, the actual test pattern ATP formed on the substrate WF may have a distorted shape that is different from that of the test pattern TP of the test layout TL.

A planar image of the actual test pattern ATP formed on the substrate WF may be obtained (in S311). FIG. 12 shows an example of such a planar image of the actual test pattern ATP. For example, the planar image may be a scanning electron microscope (SEM) image that is obtained using a SEM.

Figure 14:
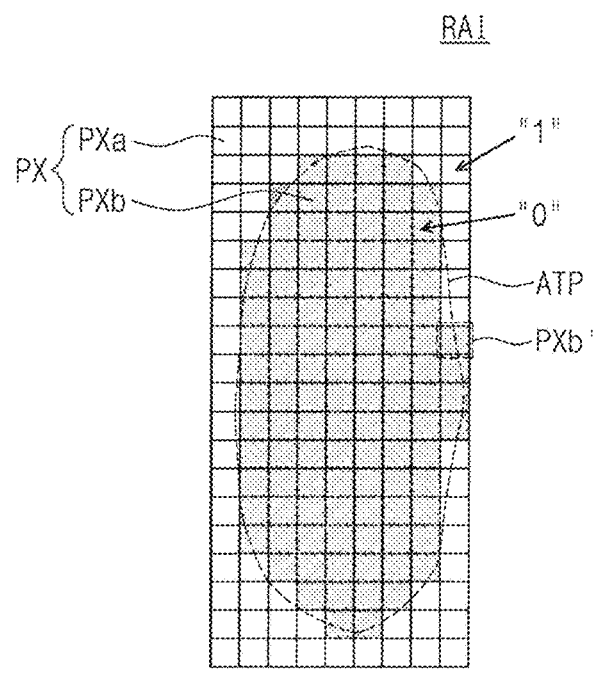
FIG. 14 is a rasterized image of a planar image of FIG. 12.

FIG. 14 is a rasterized image of a planar image of FIG. 12. Referring to FIGS. 10 and 14, a rasterization step may be performed on a planar image (in S312). In detail, a contour of the actual test pattern ATP may be extracted from the planar image. In other words, a contour image of the actual test pattern ATP may be generated from the planar image. The contour image may be divided into a plurality of pixels PX. The contour of the actual test pattern ATP may be used to classify the pixels PX into first pixels PXa, which do not overlap with the actual test pattern ATP, and second pixels PXb, which overlap with the actual test pattern ATP. As used herein, a pixel PX of an image (e.g., a contour image) is described as overlapping a pattern when a portion of the pixel PX of the image includes a portion of the pattern within it.

In some embodiments, the contour of the actual test pattern ATP may intersect one of the pixels (e.g., see PXb' in FIG. 14). For example, an overlapping region of the pixel PXb' may overlap the actual test pattern ATP, and a non-overlapping region of the pixel PXb' may not overlap the actual test pattern ATP. In a case where the overlapping region has an area larger than that of the non-overlapping region, the pixel PXb' may be defined as the second pixel PXb.

First label data may be obtained from a rasterized planar image RAI (in S313). In detail, the first pixels PXa of the rasterized planar image RAI may be labeled with a value "1." The second pixels PXb of the rasterized planar image RAI may be labeled with a value "0." This means that the rasterized planar image RAI is converted into digital data.

Referring to FIG. 10, an OPC model, in which a parameter set including a plurality of process parameters are set, may be prepared (in S320). The OPC model may be provided in and/or loaded on the OPC tool 34 of FIG. 1. The process parameters may include various parameters (e.g., intensity and/or wavelength of exposure beam, physical parameters associated with the illuminating system, physical/chemical characteristics of a photoresist material, and so forth), which are related to a photolithography process performed using the photomask.

Figure 15:
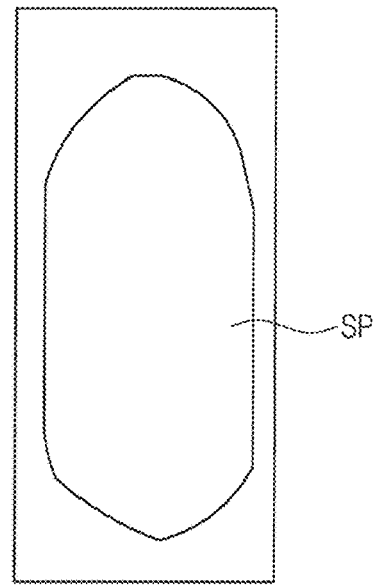
FIG. 15 is a plan view showing a simulation image, which is obtained by simulating the test layout of FIG. 11 using an OPC model.

FIG. 15 is a plan view showing a simulation image, which is obtained by simulating the test layout of FIG. 11 using an OPC model. Referring to FIGS. 10 and 15, a simulation pattern SP may be obtained by performing a simulation process on the test layout TL of FIG. 11 using an OPC model (in S321). The simulation pattern SP may be a simulation result showing an expected shape of the test pattern TP to be actually realized on a substrate. For example, the result of the simulation may be provided in the form of a contour image of the simulation pattern SP, as illustrated in FIG. 15.

Figure 16:
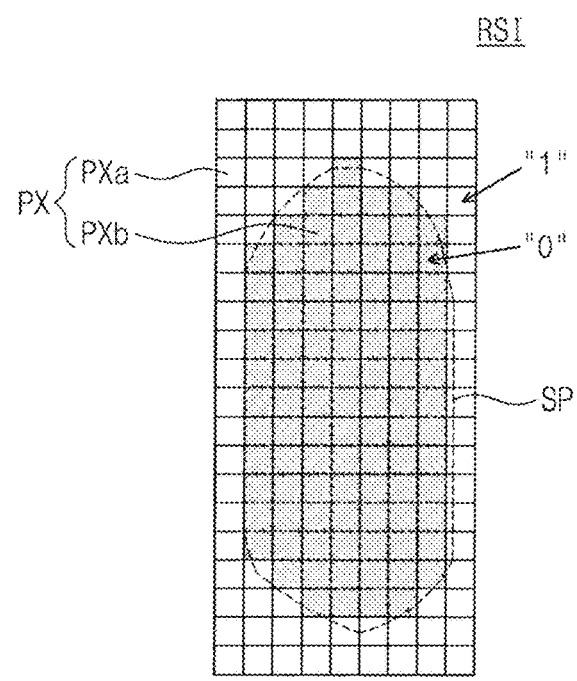
FIG. 16 is a rasterized image of the simulation image of FIG. 15.

FIG. 16 is a rasterized image of the simulation image of FIG. 15. Referring to FIGS. 10 and 16, a rasterization step may be performed on the simulation result to obtain a rasterized simulation result RSI (in S322). The rasterization of simulation result may be performed in the same or similar manner as that for the planar image (in S312). The rasterized simulation result RSI may be divided into a plurality of pixels PX. The plurality of pixels PX may include first pixels PXa, which do not overlap the simulation pattern SP, and second pixels PXb, which overlap the simulation pattern SP.

Second label data may be obtained from the rasterized simulation result RSI (in S323). The obtaining of the second label data may be performed in the same manner as that for obtaining the first label data from the rasterized planar image RAI (in S313). The rasterized simulation result RSI may be converted into digital data.

Figure 17:
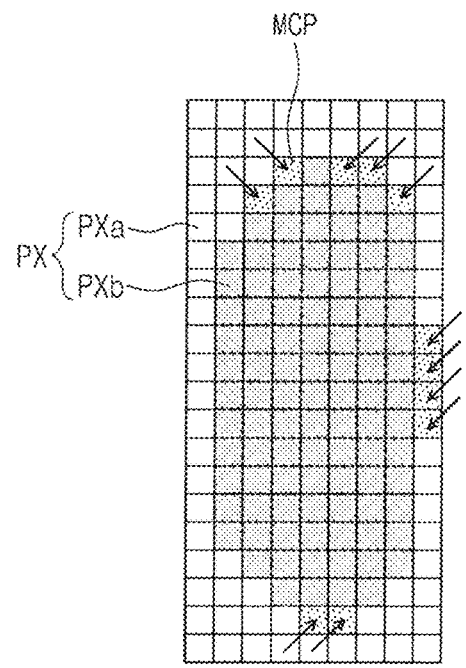
FIG. 17 is a diagram illustrating an example of the comparison between the rasterized images of FIGS. 14 and 16.

FIG. 17 is a diagram illustrating an example of the comparison between the rasterized images of FIGS. 14 and 16. Referring to FIGS. 10 and 17, a comparison step may be performed to compare the first label data, which are obtained from the rasterized planar image RAI, with the second label data, which are obtained from the rasterized simulation result RSI (in S330). By comparing the first label data with the second label data, it may be possible to evaluate a difference in shape or size between an actual pattern, which will be formed by a real fabrication process, and a simulated pattern, which is expected from the simulation.

In detail, a classification error between the first label data and the second label data may be calculated and may be examined to find whether its value is within an allowable tolerance range (in S340). The classification error may be defined as a ratio of the number of misclassified pixels to the total number of the pixels PX. Here, the misclassified pixels may mean pixels having a difference in label value between the first label data and the second label data.

For example, the first label data (i.e., from the rasterized planar image RAI of FIG. 14) may be compared with the second label data (i.e., from the rasterized simulation result RSI of FIG. 16), as illustrated in FIG. 17. The misclassified pixels are depicted by the arrows, and the number of them is 11. Since the total number of the pixels PX is 180, the classification error is 11/180 (i.e., about 0.061).

In the case where the upper limit of the allowable tolerance range of the classification error is 0.04, the classification error in the example of FIG. 17 is out of the allowable tolerance range, and in this case, the parameter set of the OPC model may be corrected (in S350). In detail, values of process parameters of the parameter set of the OPC model may be changed to set a new parameter set of the OPC model. That is, since the above value of the classification error implies a relatively large difference between the actual and simulated patterns, parameters of the OPC model may be adjusted to make a more exact prediction for the actual pattern.

The OPC model, in which the new parameter set is set, may be used to perform the previously-described steps of simulating a test layout (in S321), of rasterizing a simulation result (in S322), obtaining a second label data from a rasterized simulation result (in S323), comparing a first label data with the second label data (in S330), and examining whether a comparison error is within an allowable tolerance range (in S340) in the same manner.

Figure 18:
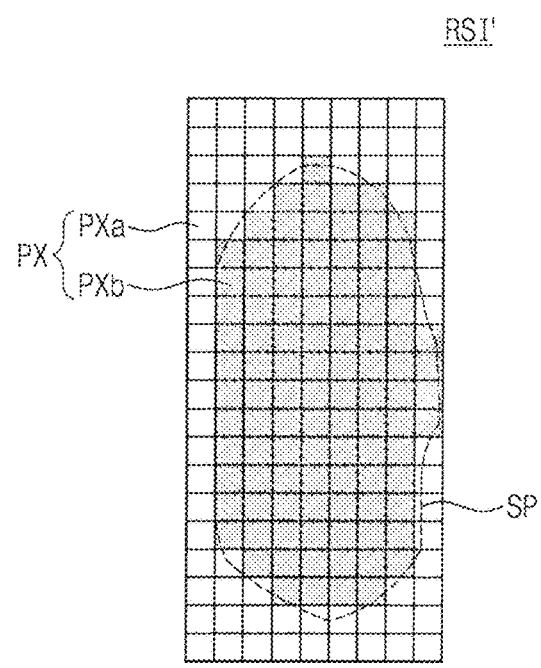
FIG. 18 is a diagram illustrating a result from simulation using an OPC model in which a new parameter set is set, and a rasterized image thereof.

FIG. 18 is a diagram illustrating a result obtained from simulation using an OPC model in which a new parameter set is set, and a rasterized image RSI' thereof. Referring to FIG. 18, since the process parameters of the OPC model have been improved, the contour of the simulation pattern SP of FIG. 18 may become different from the contour of the simulation pattern SP shown in FIGS. 15 and 16. FIG. 18 shows that the number of the second pixels PXb of the rasterized simulation result RSI' is greater by 4 than the number of the second pixels PXb of FIG. 16.

Figure 19:
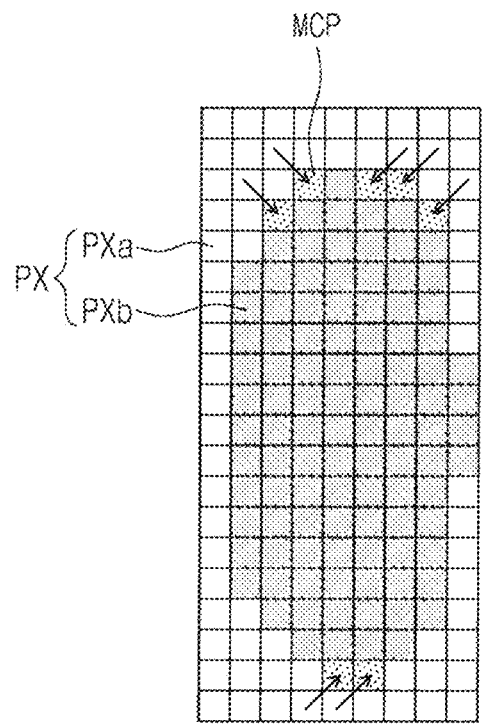
FIG. 19 is a diagram illustrating an example of the comparison between the rasterized images of FIGS. 14 and 18.

FIG. 19 is a diagram illustrating an example of the comparison between the rasterized images of FIGS. 14 and 18. Referring to FIG. 19, the first label data (i.e., from the rasterized planar image RAI of FIG. 14) may be compared with the second label data (i.e., from the rasterized simulation result RSI' of FIG. 18) (in S330). Unlike the previous case of FIG. 17, the number of the misclassified pixels may be 7, and the classification error may be 7/180 (i.e., about 0.039). Since the classification error is within the allowable tolerance range (e.g., 0.04), the OPC model, in which the new parameter set is set, may be used as an optimized and/or improved model capable of more precisely predicting the actual shape. In other words, the optimized and/or improved OPC model may be obtained by the steps depicted in FIG. 10. The designed layout may be corrected or biased using the optimized and/or improved OPC model.

In the improvement of the OPC model according to some embodiments of the inventive concepts, information on the entire region of a two-dimensional image of an actual test pattern may be effectively compared with information on the entire region of a two-dimensional image of a simulated pattern. Since the two-dimensional information is wholly considered, it may be possible to obtain an OPC model with improved reliability.

Figure 20:
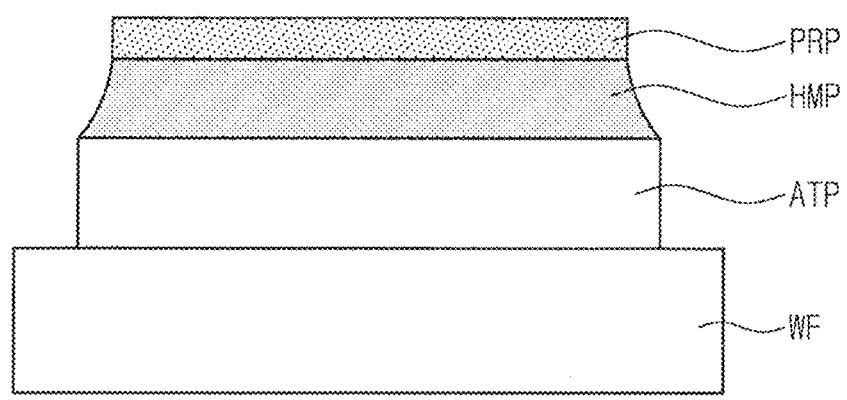
FIG. 20 is a sectional view illustrating another example of a vertical section of the pattern of FIG. 12.

FIG. 20 is a sectional view illustrating another example of a vertical section of the pattern of FIG. 12. Referring to FIGS. 10 and 20, the actual test pattern ATP may be formed on a substrate WF by using a photoresist pattern PRP, which is formed by a photolithography process, as a mask.

In the previous embodiment described with reference to FIG. 13, the actual test pattern ATP may be a photoresist pattern that is formed by exposing and developing a photoresist layer. However, in some embodiments, the actual test pattern ATP may be used to obtain information not only on such a photolithography process but also on an etching process on a hard mask and a target layer provided below the photoresist layer.

For example, a target layer, a hard mask layer, and a photoresist layer may be sequentially formed on a substrate WF. A test mask may be fabricated based on the test layout TL of FIG. 11, an exposure process using the test mask may be performed on the photoresist layer, and the photoresist pattern PRP may be formed by developing the exposed photoresist layer. The hard mask layer may be etched using the photoresist pattern PRP as an etch mask, thereby forming a hard mask pattern HMP. The target layer may be etched using the photoresist pattern PRP and the hard mask pattern HMP as an etch mask, thereby forming the actual test pattern ATP.

In some embodiments, since the actual test pattern ATP is formed by not only the photolithography process but also the etching process using the etch mask, the actual test pattern ATP may be largely distorted, compared with the test pattern TP of FIG. 11. Since the actual test pattern ATP according to some embodiments may be obtained from actual processes that are performed to form a target pattern on the substrate WF, it may contain more information about the actual processes, when compared with the actual test pattern ATP of FIG. 13. In the case where the generation of the improved OPC model (in S31) of FIG. 10 is performed using a planar image of the actual test pattern ATP according to some embodiments, it may be possible to obtain an OPC model with more improved reliability.

Figure 21:
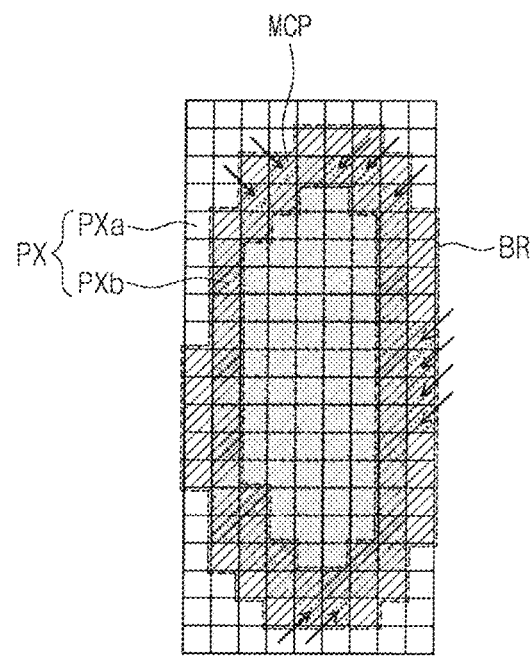
FIG. 21 is a diagram illustrating another example of the comparison between the rasterized images of FIGS. 14 and 16.

FIG. 21 is a diagram illustrating another example of the comparison between the rasterized images of FIGS. 14 and 16. Referring to FIGS. 10 and 21, only pixels in a boundary region BR may be considered for the comparison between the first label data and the second label data, when the first label data is compared with the second label data (in S330). The boundary region BR may be a region adjacent to the contour of the actual test pattern ATP. In some embodiments, all and/or most of the misclassified pixels may be included within the boundary region BR. This is because a difference between the actual test pattern and the simulation pattern occurs along or near the contour.

In some embodiments, the classification error may be defined as a ratio of the number of misclassified pixels MCP within the boundary region BR to the number of the pixels PX within the boundary region BR. For example, in the example of FIG. 21, the number of the misclassified pixels MCP within the boundary region BR is 11. Since the number of the pixels PX within the boundary region BR is 72, the classification error may be 11/72 (i.e., about 0.153).

In some embodiments, since the comparison between the first and second label data is performed on only a region where the error is likely to occur, it may be possible to reduce a process time and to obtain a highly-reliable classification error value.

Figure 22:
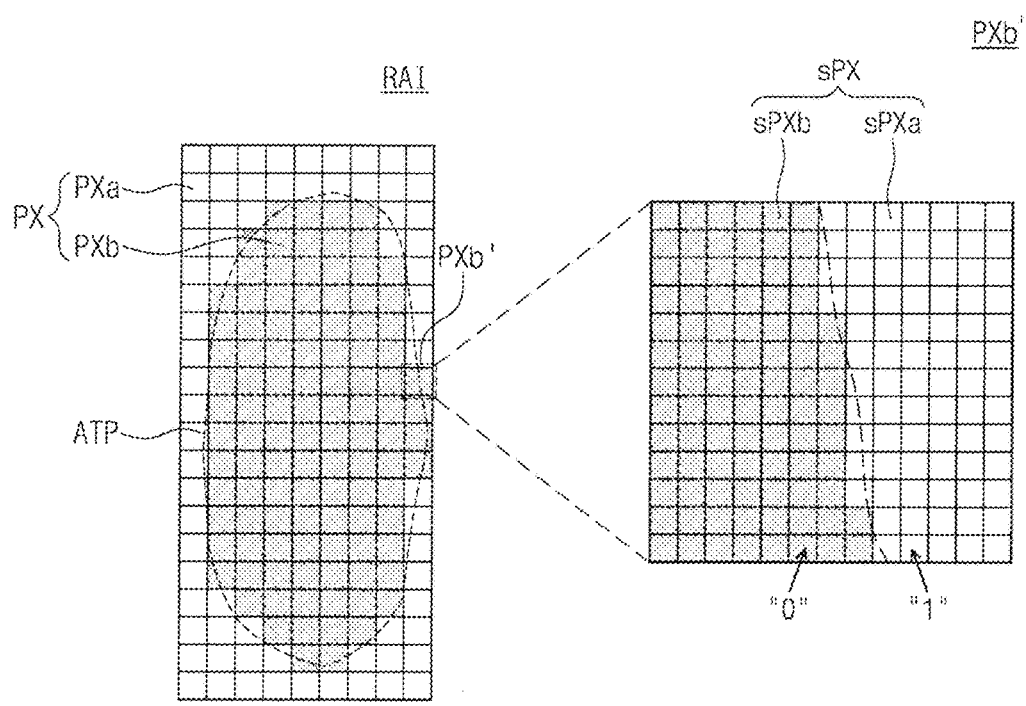
FIG. 22 is a diagram illustrating a result obtained by sub-sampling one pixel in the rasterized image of FIG. 14.

FIG. 22 is a diagram illustrating a result obtained by sub-sampling one pixel in the rasterized image of FIG. 14. Referring to FIGS. 10 and 22, in the rasterization step S312 of the planar image, a sub-sampling may be performed on at least one pixel PXb' intersected by the contour of the actual test pattern ATP.

For example, the pixel PXb' may be divided into a plurality of sub-pixels sPX. Each of the sub-pixels sPX may be smaller than each of the pixels PX. The contour of the actual test pattern ATP may be used to classify the sub-pixels sPX into first sub-pixels sPXa, which do not overlap the actual test pattern ATP, and second sub-pixels sPXb, which overlap the actual test pattern ATP. The first sub-pixels sPXa may be labeled with a value of "1," and the second sub-pixels sPXb may be labeled with a value of "0."

In addition, although not shown, even in the rasterization step S322 of the simulation result, the previously-described sub-sampling may be performed, in the same or similar manner, on at least one pixel, which is intersected by the contour of the simulation pattern SP. By comparing the first and second label data, which are obtained by such a sub-sampling process, to each other, it may be possible to obtain a relevant classification error.

At a pixel intersected by the contour, there may be a large difference between the actual test pattern and the simulation pattern. In the sub-sampling method according embodiments of the inventive concepts, at least one pixel intersected by the pattern contour may be extracted and then may be divided into a plurality of sub-pixels, and this may make it possible to obtain a highly-reliable classification error value.

Figure 23:
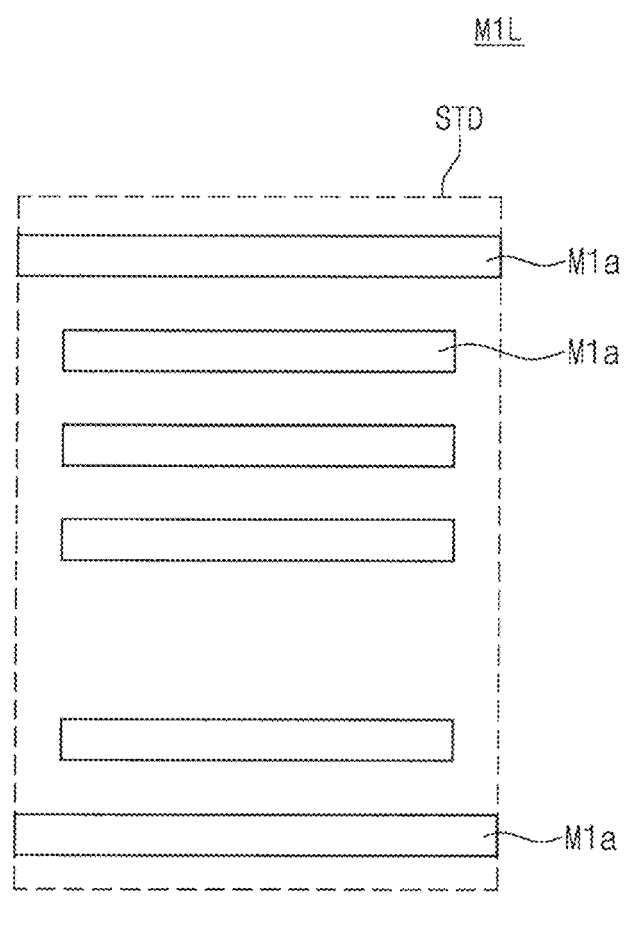
FIG. 23 is a plan view illustrating a layout designed for a first interconnection layer of a semiconductor device.
Figure 24:
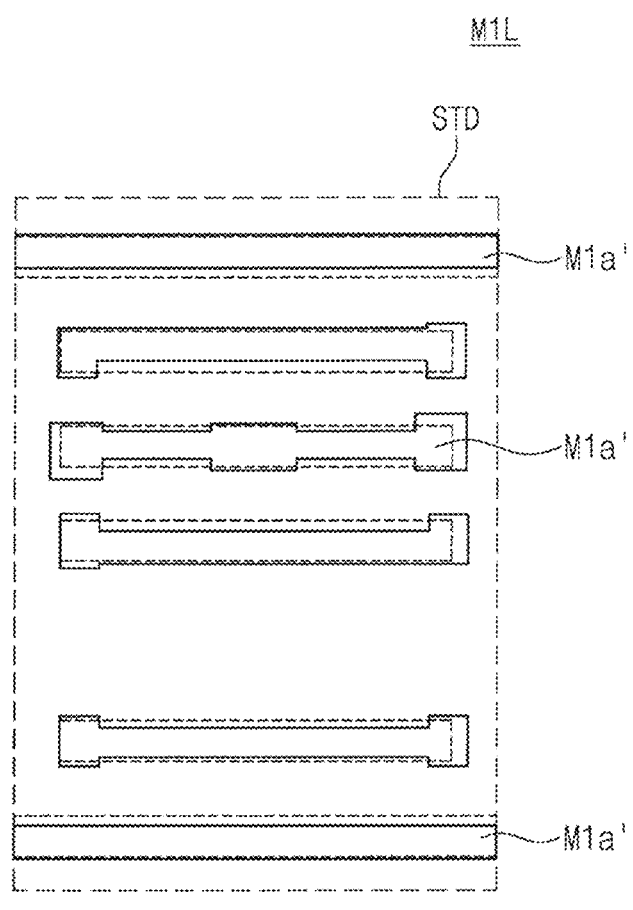
FIG. 24 is a plan view illustrating a result obtained by performing an OPC method, according to some embodiments of the inventive concepts, on the designed layout of FIG. 23.

FIG. 23 is a plan view illustrating a layout designed for a first interconnection layer of a semiconductor device. FIG. 24 is a plan view illustrating a result obtained by performing an OPC method, according to some embodiments of the inventive concepts, on the designed layout of FIG. 23.

Referring to FIG. 23, a designed layout of a standard cell STD of a semiconductor device may be provided. The designed layout of the standard cell STD may be a result that is obtained from the layout design S20 previously described with reference to FIG. 2. The designed layout of the standard cell STD may include a plurality of layers. In FIG. 23, a first interconnection layer M L is illustrated as a typical example of one of the plurality of layers.

The first interconnection layer M1L may include a plurality of first interconnection patterns M1a. The first interconnection patterns M1a may have a line or bar shape extending in a second direction D2. The first interconnection patterns M1a may be arranged spaced apart from each other in a first direction D1.

Referring to FIG. 24, the OPC step S30 previously described with reference to FIGS. 9 and 10 may be performed. In detail, the OPC model may be optimized and/or improved using the method previously described with reference to FIGS. 10 through 22 (in S31), and the designed layout of the standard cell STD may be corrected and/or biased using the optimized and/or improved OPC model (in S37). As a result of the OPC step, the first interconnection patterns M1a of the first interconnection layer M1L (e.g., see dotted line) may be changed to first corrected patterns M1a'.

Figure 28A:
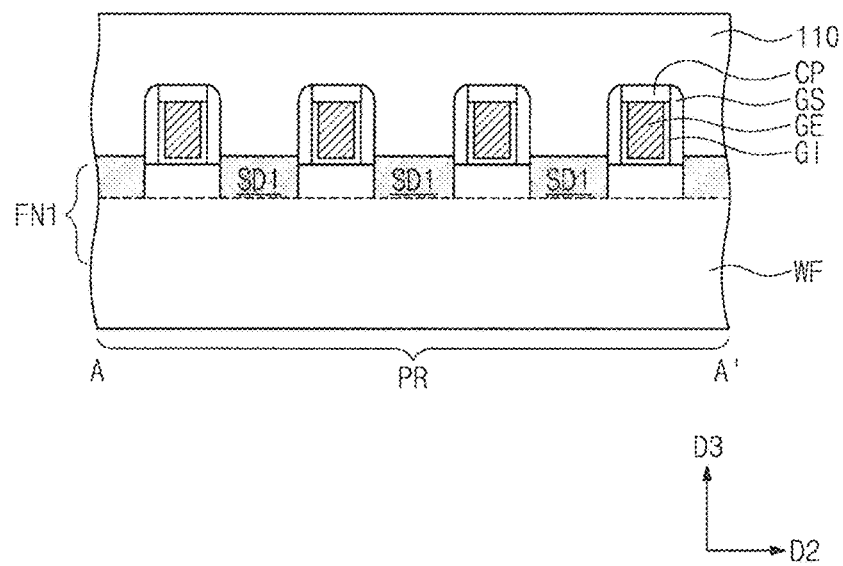
Figure 28B:
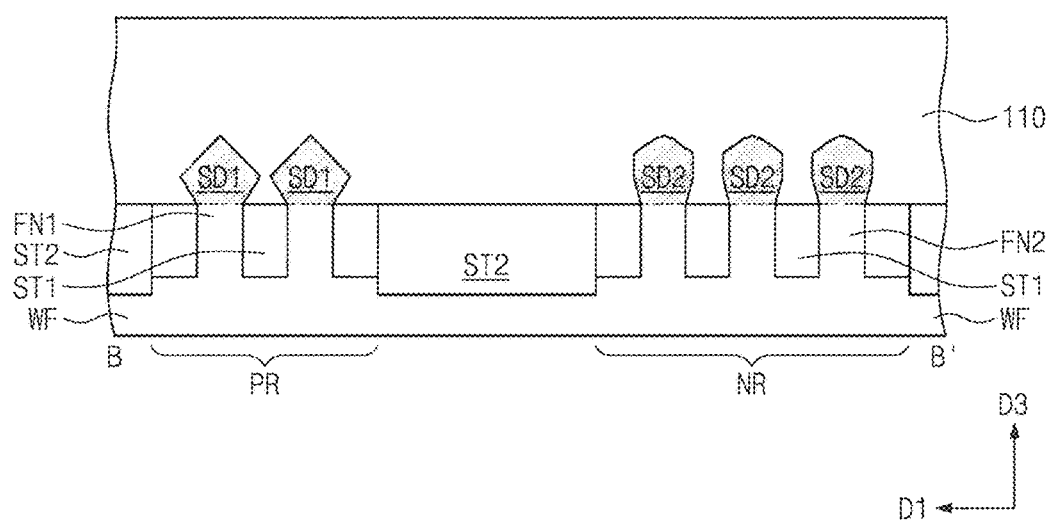
Figure 28C:
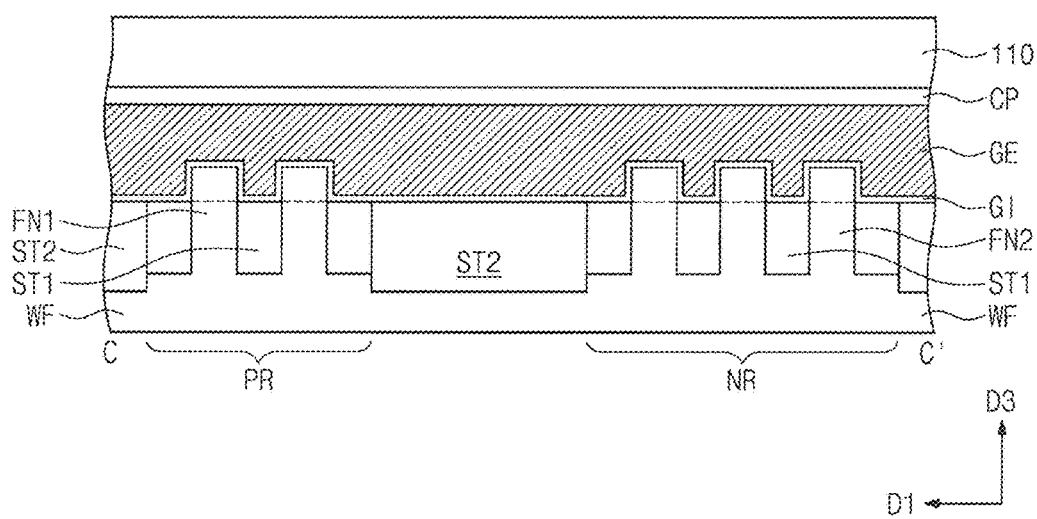
FIGS. 28C, 30C, and 32C are sectional views taken along lines C-C' of FIGS. 27, 29, and 31, respectively.
Figure 29:
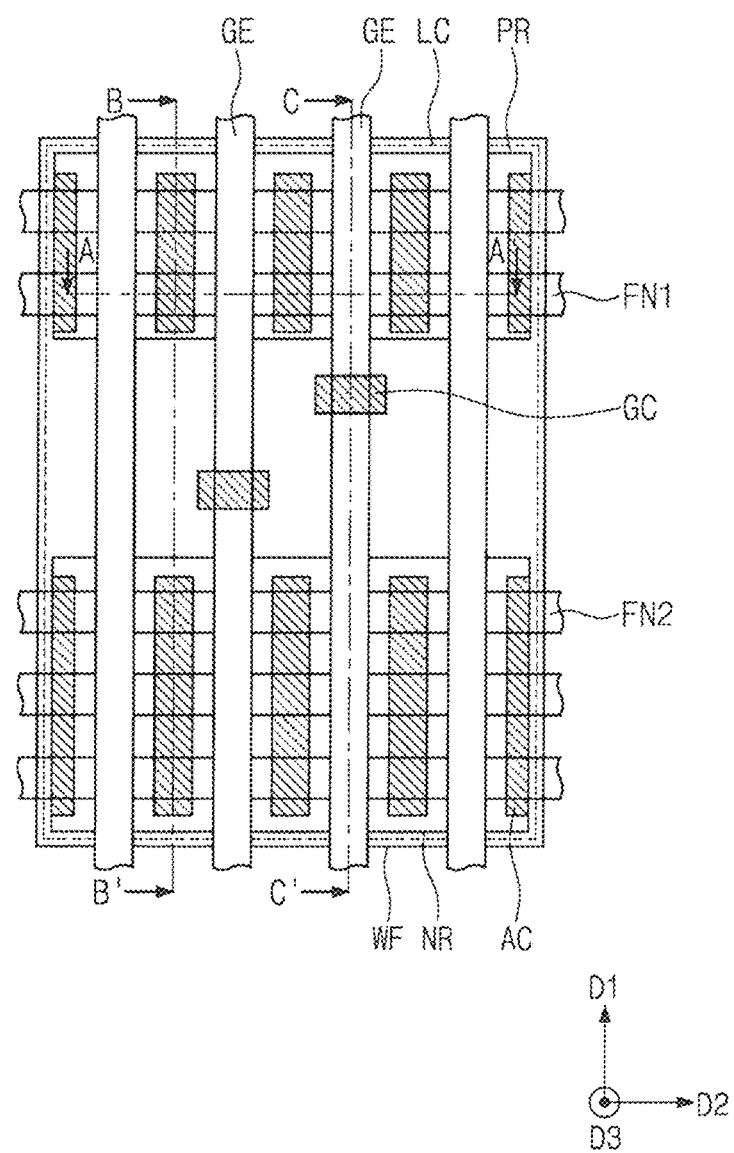
Figure 30A:
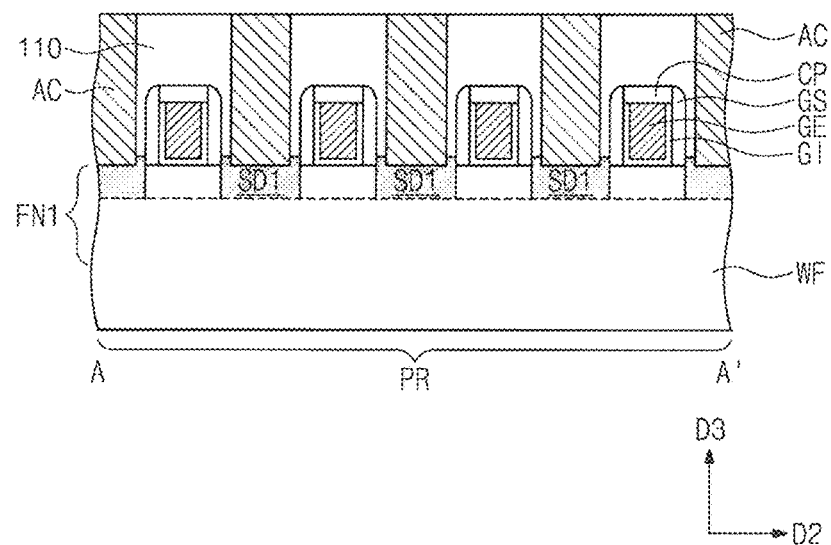
Figure 30B:
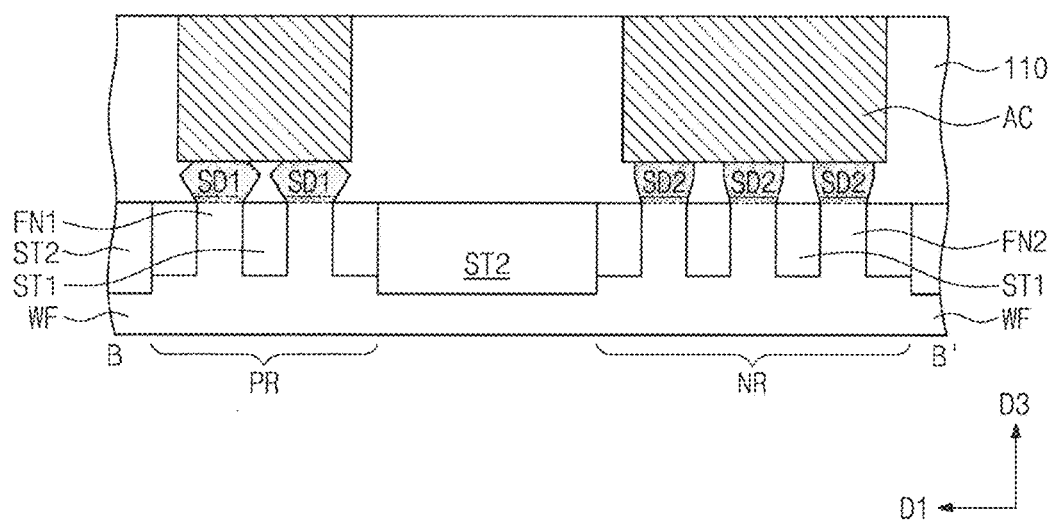
Figure 30C:
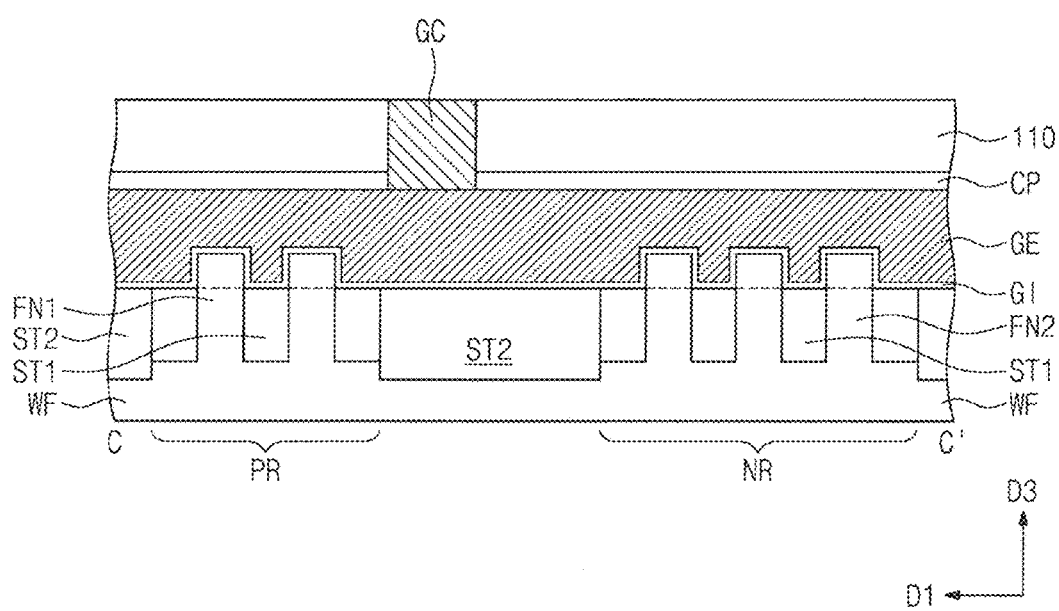
Figure 31:
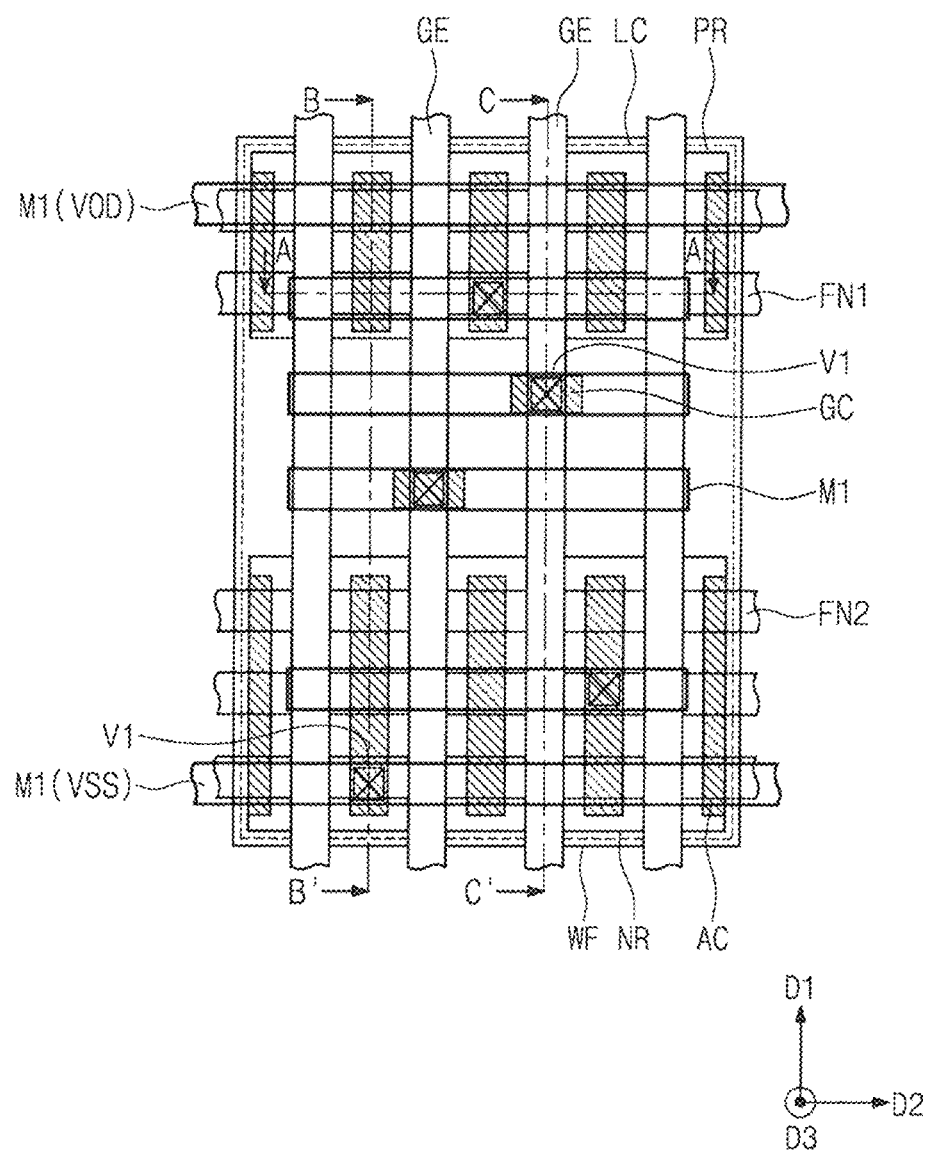
Figure 32A:
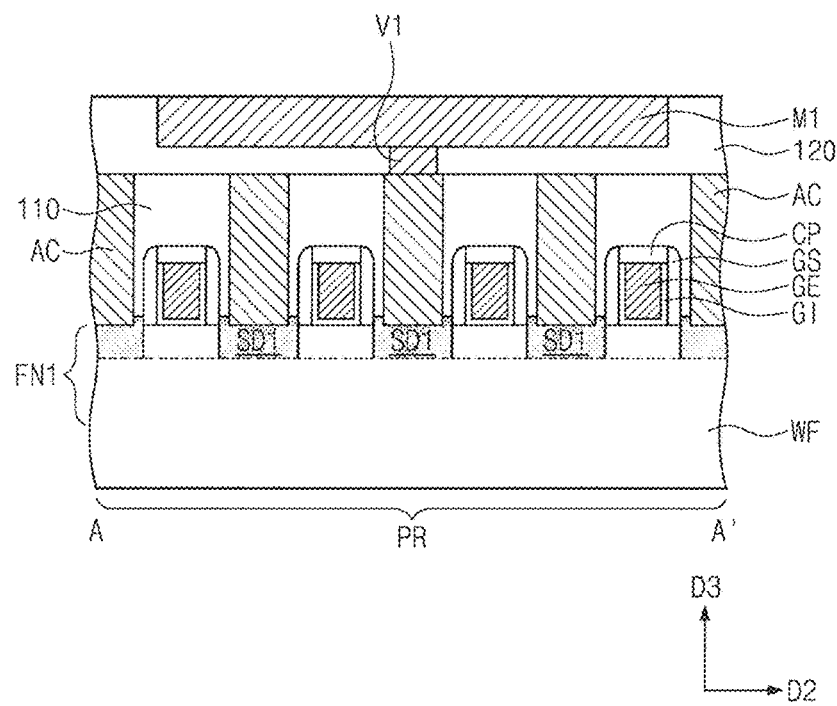
Figure 32B:
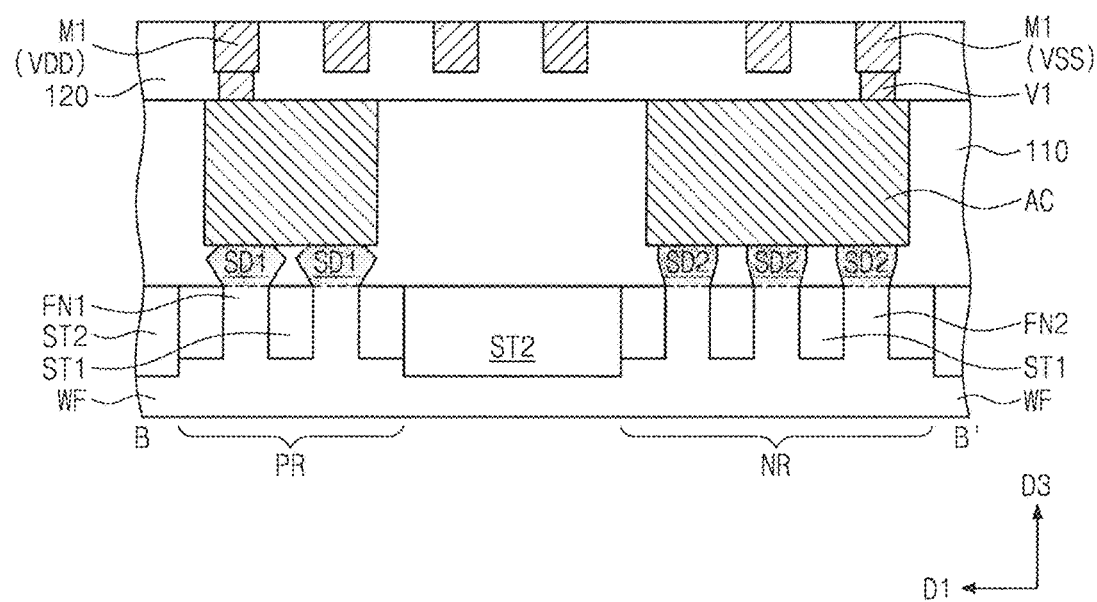
Figure 32C:
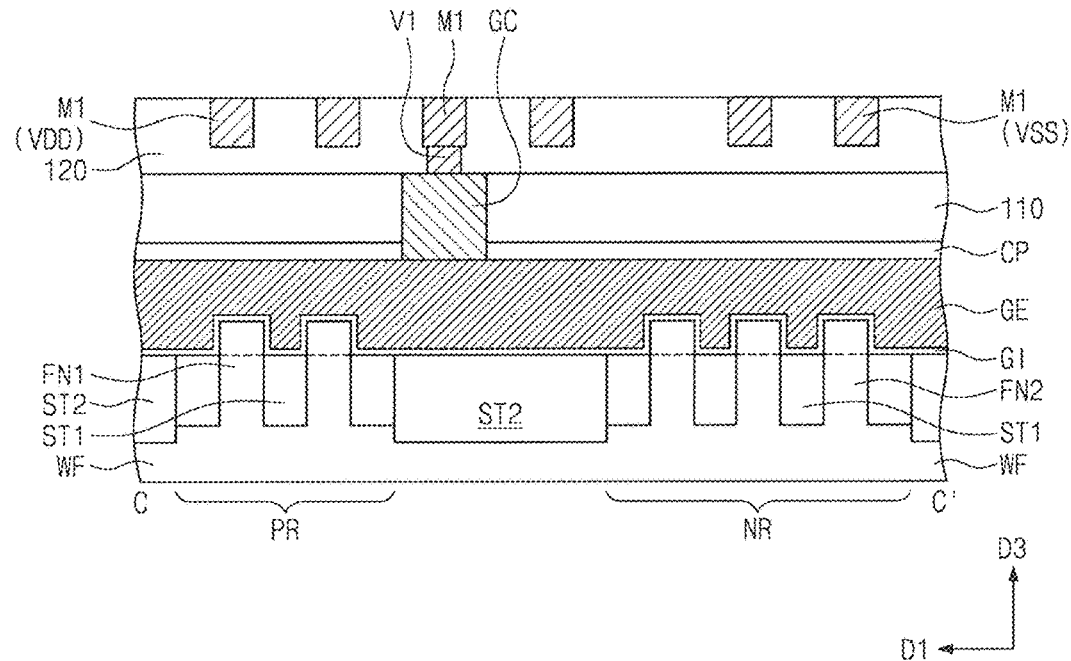

FIGS. 25, 27, 29 and 31 are plan views illustrating a method of fabricating semiconductor devices, according to some embodiments of the inventive concepts. FIGS. 26A, 28A, 30A, and 32A are sectional views taken along lines A-A' of FIGS. 25, 27, 29, and 31, respectively, FIGS. 26I, 28B, 30I, and 32B are sectional views taken along lines B-B' of FIGS. 25, 27, 29, and 31, respectively, and FIGS. 28C, 30C, and 32C are sectional views taken along lines C-C' of FIGS. 27, 29, and 31, respectively.

Figure 25:
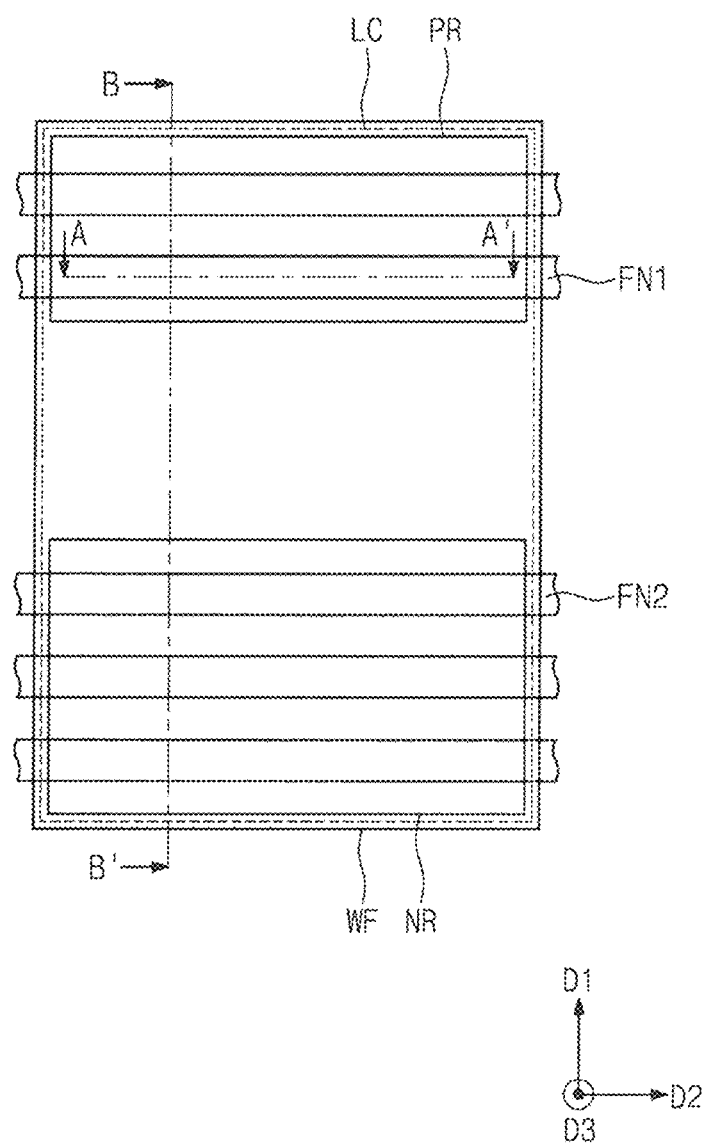
FIGS. 25, 27, 29 and 31 are plan views illustrating a method of fabricating semiconductor devices, according to some embodiments of the inventive concepts.
Figure 26A:
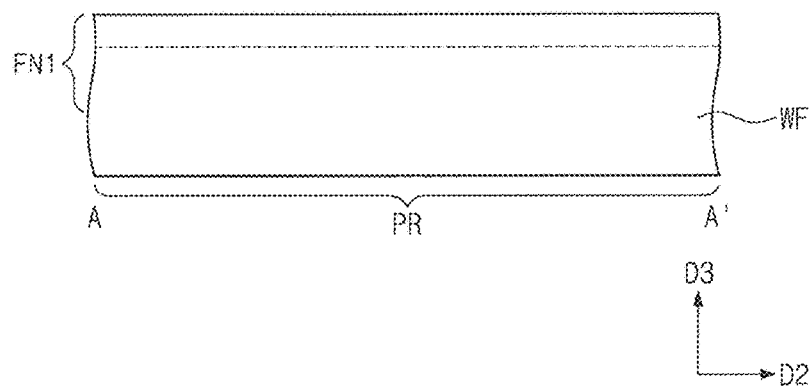
FIGS. 26A, 28A, 30A, and 32A are sectional views taken along lines A-A' of FIGS. 25, 27, 29, and 31, respectively.
Figure 26B:
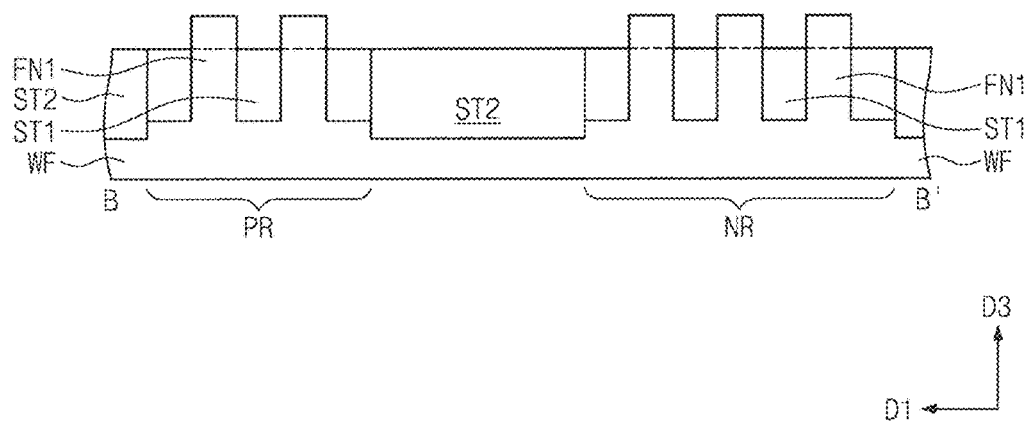
FIGS. 26B, 28B, 30B, and 32B are sectional views taken along lines B-B' of FIGS. 25, 27, 29, and 31, respectively.
Figure 27:
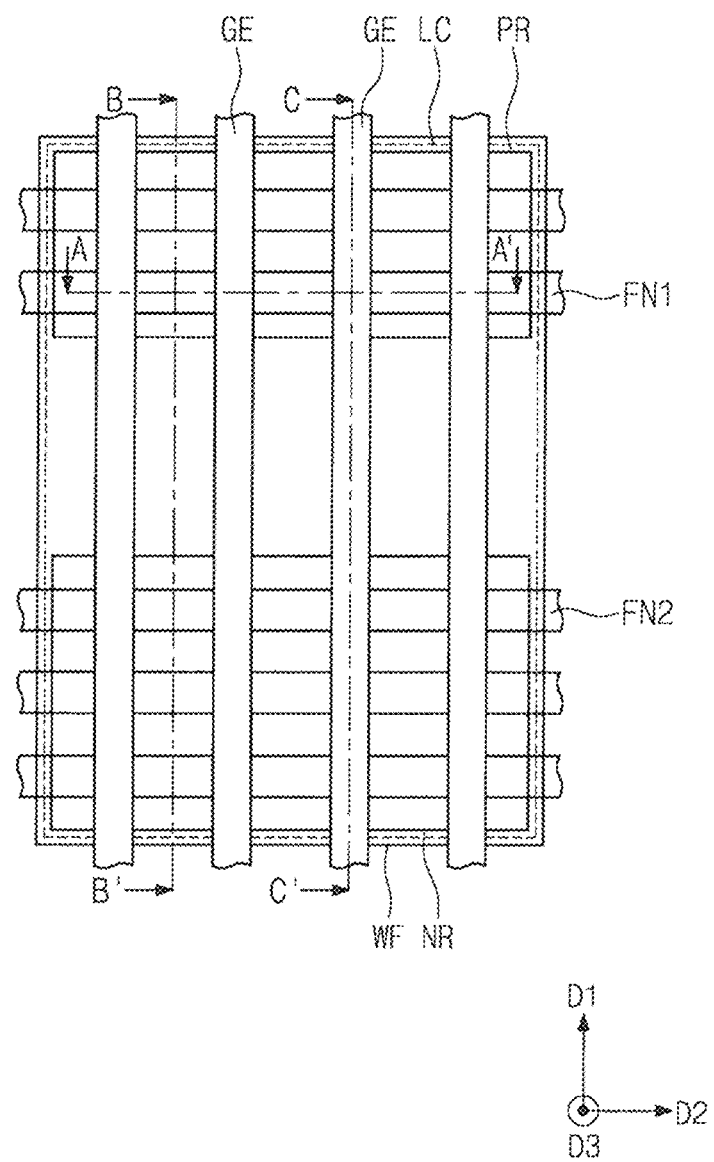

Referring to FIGS. 25, 26A, and 26B, a substrate WF with a cell region LC may be provided. The cell region LC may be a region of the substrate WF corresponding to the standard cell STD described with reference to FIGS. 23 and 24. The substrate WF may be, for example, a silicon substrate, a germanium substrate, or a silicon-on-insulator (SOI) substrate. An upper portion of the substrate WF may be patterned to form first and second active patterns FN1 and FN2. First device isolation layers ST1 may be formed to fill gap regions between the first and second active patterns FN1 and FN2. Second device isolation layers ST2 may be formed on the substrate WF to define a PMOSFET region PR and an NMOSFET region NR.

The first and second device isolation layers ST1 and ST2 may be formed by a shallow trench isolation (STI) process. The first and second device isolation layers ST1 and ST2 may be formed of or include silicon oxide, though the inventive concepts are not limited thereto.

Referring to FIGS. 27, 28A, 28B, and 28C, gate electrodes GE may be formed to cross the first and second active patterns FN1 and FN2 to extend in a first direction D1. Gate dielectric layers GI may be formed under the gate electrodes GE. Gate spacers GS may be formed on both side surfaces of each of the gate electrodes GE. Gate capping layers CP may be formed on the gate electrodes GE, respectively.

In detail, the formation of the gate electrodes GE may include forming sacrificial patterns to cross the first and second active patterns FN1 and FN2, forming the gate spacers GS at both sides of the sacrificial patterns, and replacing the sacrificial patterns with the gate electrodes GE.

The gate electrodes GE may be formed of or include at least one of conductive metal nitrides (e.g., titanium nitride and/or tantalum nitride) and/or metals (e.g., titanium, tantalum, tungsten, copper, and/or aluminum), though the inventive concepts are not limited thereto. The gate dielectric layers GI may be formed of or include a high-k dielectric material whose dielectric constant is higher than that of silicon oxide, though the inventive concepts are not limited thereto. The gate spacers GS may be formed of or include at least one of SiCN, SiCON, or SiN, v. The gate capping layers CP may be formed of or include at least one of SiON, SiCN, SiCON, or SiN, though the inventive concepts are not limited thereto.

First source/drain regions SD1 may be formed on the first active patterns FN1. Second source/drain regions SD2 may be formed on the second active patterns FN2. The first and second source/drain regions SD1 and SD2 may be formed at both sides of each of the gate electrodes GE. The first source/drain regions SD1 may be regions that are doped with p-type impurities, and the second source/drain regions SD2 may be regions that are doped with n-type impurities.

For example, the first and second source/drain regions SD1 and SD2 may be epitaxial patterns, which are formed by a selective epitaxial growth process. In detail, the formation of the first and second source/drain regions SD1 and SD2 may include partially recessing the first and second active patterns FN1 and FN2 at both sides of each of the gate electrodes GE and performing the epitaxial growth process to form the epitaxial patterns in the recessed regions of the first and second active patterns FN1 and FN2.

A first interlayered insulating layer 110 may be formed on a top surface of the substrate WF. The first interlayered insulating layer 110 may be formed of or include a silicon oxide layer and/or a silicon oxynitride layer, though the inventive concepts are not limited thereto.

Referring to FIGS. 29, 30A, 30B, and 30C, active contacts AC and gate contacts GC may be formed in the first interlayered insulating layer 110. The active contacts AC may be formed on the first and second source/drain regions SD1 and SD2. Each of the active contacts AC may be formed to have a bar shape extending in the first direction D1. The gate contacts GC may be formed on the gate electrodes GE. Each of the gate contacts GC may be formed to have a bar shape extending in a second direction D2. The active contacts AC and the gate contacts GC may be formed of or include at least one of metallic materials (e.g., aluminum, copper, tungsten, molybdenum, and/or cobalt), though the inventive concepts are not limited thereto.

Referring to FIGS. 31, 32A, 32B, and 32C, a second interlayered insulating layer 120 may be formed on the first interlayered insulating layer 110. The second interlayered insulating layer 120 may be formed of a silicon oxide layer and/or a silicon oxynitride layer, though the inventive concepts are not limited thereto.

First interconnection lines M1 and first vias V1 may be formed in the second interlayered insulating layer 120. The first vias V1 may be formed between the first interconnection lines M1 and the active contacts AC and between the first interconnection lines M1 and the gate contacts GC. Each of the first interconnection lines M1 may be formed to have a line or bar shape extending in the second direction D2.

The first interconnection lines M1 may be formed, based on the first interconnection layer M1L (see FIGS. 23 and 24), on which the OPC step previously described with reference to FIG. 24 has been performed. For example, a photomask may be manufactured, based on the first interconnection layer M1L of FIG. 24. A photolithography process using the photomask may be performed to form photoresist patterns, which will be used to define positions and shapes of the first interconnection lines M on the second interlayered insulating layer 120. An upper portion of the second interlayered insulating layer 120 may be etched using the photoresist pattern as an etch mask to form interconnection holes. The first interconnection lines M may be formed by filling the interconnection holes with a conductive material. Although not shown, at least one interlayered insulating layer and at least one interconnection layer may be additionally formed on the second interlayered insulating layer 120.

The first interconnection lines M may be formed to have planar shapes that are substantially similar to those of the first interconnection patterns M1a in the designed layout shown in FIG. 23. This is because, as described with reference to some embodiments of the inventive concepts, the OPC model is optimized and/or improved, and the optimized and/or improved OPC model is used for the OPC step.

In a method of optimizing and/or improving an OPC model according to some embodiments of the inventive concepts, it may be possible to effectively compare information on the entire region of a two-dimensional image of an actual pattern with information on the entire region of a two-dimensional image obtained as a result of simulation. Since two-dimensional information is considered, it may be possible to obtain a highly reliable OPC model.

It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When a certain example embodiment may be implemented differently, a specific process order may be performed differently from the described order. For example, two consecutively described processes may be performed substantially at the same time or performed in an order opposite to the described order.

In the accompanying drawings, variations from the illustrated shapes as a result, for example, of manufacturing techniques and/or tolerances, are to be expected. Thus, the example embodiments of the inventive concepts should not be construed as being limited to the particular shapes of regions illustrated herein but may be construed to include deviations in shapes that result, for example, from a manufacturing process. For example, an etched region illustrated as a rectangular shape may be a rounded or certain curvature shape. Thus, the regions illustrated in the figures are schematic in nature, and the shapes of the regions illustrated in the figures are intended to illustrate particular shapes of regions of devices and not intended to limit the scope of the present inventive concepts. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

While some embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor device, the method comprising:
    designing a designed layout;
    performing an optical proximity correction (OPC) process to correct the designed layout;
    fabricating a first photomask using the corrected designed layout; and
    forming patterns on a substrate using the first photomask,
    wherein the OPC process comprises generating an OPC model and correcting the designed layout using the generated OPC model, and
    wherein the generating of the OPC model comprises:
    rasterizing a planar image of an actual pattern to obtain first label data;
    rasterizing a simulation image of a simulation pattern to obtain second label data, the simulation pattern being obtained using the OPC model, in which a parameter set including process parameters is set;
    comparing the first label data with the second label data to obtain comparison data; and
    correcting the process parameters of the parameter set, based on the comparison data.

2. The method of claim 1, wherein the rasterizing of the planar image of the actual pattern comprises:
    dividing the planar image into a plurality of pixels; and
    classifying the plurality of pixels into first pixels, which do not overlap the actual pattern, and second pixels, which do overlap the actual pattern.

3. The method of claim 2, wherein the rasterizing of the planar image of the actual pattern further comprises:
    dividing at least one pixel, which is intersected by a contour of the actual pattern, into a plurality of sub-pixels; and
    classifying the plurality of sub-pixels into first sub-pixels, which do not overlap the actual pattern, and second sub-pixels, which do overlap the actual pattern.

4. The method of claim 2, wherein the obtaining of the first label data comprises:
    labeling the first pixels with a first value; and
    labeling the second pixels with a second value different from the first value.

5. The method of claim 1, wherein the rasterizing of the simulation image comprises:
    dividing the simulation image into a plurality of pixels; and
    classifying the plurality of pixels into first pixels, which do not overlap the simulation pattern, and second pixels, which do overlap the simulation pattern.

6. The method of claim 1, wherein the obtaining of the comparison data comprises obtaining a classification error, and
    wherein the correcting of the process parameters of the parameter set is repeated until the classification error has a value within an allowable tolerance range.

7. The method of claim 1, wherein the actual pattern is formed on a wafer using a test layout including a test pattern, and wherein the simulation pattern is obtained by simulating the test layout using the OPC model.

8. The method of claim 7, wherein the forming of the actual pattern comprises:
sequentially forming a target layer, a hard mask layer, and a photoresist layer on the wafer;
performing a photolithography process with a second photomask fabricated using the test layout to form a photoresist pattern;
etching the hard mask layer using the photoresist pattern as an etch mask to form a hard mask pattern; and
etching the target layer using the hard mask pattern as an etch mask to form the actual pattern.

9. The method of claim 1, wherein the rasterizing of the planar image of the actual pattern comprises dividing the planar image into a plurality of first pixels,
wherein the rasterizing of the simulation image comprises dividing the simulation image into a plurality of second pixels,
wherein the comparing of the first label data with the second label data comprises selectively comparing at least one of the plurality of first pixels within a boundary region with at least one of the plurality of second pixels within the boundary region, and
wherein the boundary region is a region adjacent to a contour of the actual pattern.

10. The method of claim 1, wherein the planar image of the actual pattern is obtained using a scanning electron microscope (SEM).

11. A method of fabricating a semiconductor device, the method comprising:
generating an optical proximity correction (OPC) model; and
performing an OPC process on a designed layout using the generated OPC model,
wherein the generating of the OPC model comprises:
dividing a planar image of an actual pattern into a first plurality of pixels, the first plurality of pixels of the planar image comprising first pixels that overlap the actual pattern;
dividing a simulation image of a simulation pattern into a second plurality of pixels, the simulation pattern being obtained using the OPC model, the second plurality of pixels of the simulation image comprising second pixels that overlap the simulation pattern;
comparing the first pixels with the second pixels to obtain comparison data; and
correcting a parameter set of the OPC model, based on the comparison data.

12. The method of claim 11, wherein the actual pattern is formed on a substrate using a test layout including a test pattern, and
wherein the simulation pattern is obtained by simulating the test layout using the OPC model.

13. The method of claim 11, wherein the obtaining of the comparison data comprises obtaining a classification error, and
wherein the classification error is defined as a ratio of a difference between a number of the first pixels and a number of the second pixels to a number of the first plurality of pixels of the planar image.

14. The method of claim 11, further comprising:
designing a layout comprising a first interconnection layer;
fabricating a photomask using the first interconnection layer, on which the OPC process is performed;
performing a photolithography process using the photomask to form a photoresist pattern on an interlayered insulating layer;
etching the interlayered insulating layer using the photoresist pattern as an etch mask to form interconnection holes; and
filling the interconnection holes with a conductive material to form first interconnection lines in the interlayered insulating layer.

15. The method of claim 11, wherein the planar image of the actual pattern is obtained using a scanning electron microscope (SEM).

16. A method of generating an optical proximity correction (OPC) model, the method comprising:
forming an actual pattern on a substrate using a test layout including a test pattern;
dividing a planar image of the actual pattern into a first plurality of pixels;
labeling the first plurality of pixels of the planar image, based on a first contour of the actual pattern, to obtain first label data;
simulating the test layout using an OPC model to obtain a simulation image;
dividing the simulation image into a second plurality of pixels;
labeling the second plurality of pixels of the simulation image, based on a second contour of a pattern in the simulation image, to obtain second label data;
comparing the first label data with the second label data to obtain comparison data; and
correcting a parameter set of the OPC model, based on the comparison data.

17. The method of claim 16, wherein the obtaining of the first label data comprises:
classifying the first plurality of pixels of the planar image into first pixels, which do not overlap the actual pattern, and second pixels, which do overlap the actual pattern;
labeling the first pixels with a first value; and
labeling the second pixels with a second value different from the first value.

18. The method of claim 16, wherein the forming of the actual pattern comprises:
forming a photoresist layer on the substrate; and
performing a photolithography process with a photomask fabricated using the test layout to form a photoresist pattern.

19. The method of claim 18, wherein the forming of the actual pattern further comprises:
forming a target layer and a hard mask layer between the substrate and the photoresist layer;
etching the hard mask layer using the photoresist pattern as an etch mask to form a hard mask pattern; and
etching the target layer using the hard mask pattern as an etch mask to form the actual pattern.

20. The method of claim 16, wherein the obtaining of the comparison data comprises obtaining a classification error,
wherein the correcting of the parameter set is repeated until the classification error has a value within an allowable tolerance range.

* * * * *